(12) United States Patent
Jeon et al.

(10) Patent No.: US 9,245,605 B2
(45) Date of Patent: Jan. 26, 2016

(54) CLOCK SYNCHRONIZATION CIRCUIT AND SEMICONDUCTOR MEMORY DEVICE INCLUDING CLOCK SYNCHRONIZATION CIRCUIT

(71) Applicant: SAMSUNG ELECTRONICS CO., LTD., Suwon-si, Gyeonggi-do (KR)

(72) Inventors: Seong-Hwan Jeon, Suwon-si (KR); Yang-Ki Kim, Seoul (KR); Seok-Hun Hyun, Seongnam-si (KR); Jung-Hwan Choi, Hwaseong-si (KR)

(73) Assignee: Samsung Electronics Co., Ltd., Suwon-si, Gyeongg-do (KR)

( * ) Notice: Subject to any disclaimer, the term of this patent is extended or adjusted under 35 U.S.C. 154(b) by 0 days.

(21) Appl. No.: 14/250,460

(22) Filed: Apr. 11, 2014

(65) Prior Publication Data

US 2014/0313847 A1 Oct. 23, 2014

Related U.S. Application Data

(60) Provisional application No. 61/812,772, filed on Apr. 17, 2013.

(30) Foreign Application Priority Data

Sep. 17, 2013 (KR) .......................... 10-2013-0111935

(51) Int. Cl.
| | |
|---|---|
| *G11C 8/18* | (2006.01) |
| *G11C 7/22* | (2006.01) |
| *H03L 7/081* | (2006.01) |
| *H03L 7/095* | (2006.01) |
| *H03L 7/10* | (2006.01) |

(52) U.S. Cl.
CPC ............. *G11C 8/18* (2013.01); *G11C 7/222* (2013.01); *H03L 7/0814* (2013.01); *H03L 7/0816* (2013.01); *H03L 7/095* (2013.01); *H03L 7/10* (2013.01)

(58) Field of Classification Search
None
See application file for complete search history.

(56) References Cited

U.S. PATENT DOCUMENTS

| | | | |
|---|---|---|---|
| 7,215,166 | B2 | 5/2007 | Tani |
| 7,660,171 | B2 | 2/2010 | Jang |
| 7,881,132 | B2 | 2/2011 | Shin |
| 2002/0125926 | A1* | 9/2002 | Schnell ................ G11C 7/1066 327/156 |
| 2008/0238507 | A1 | 10/2008 | Shim |
| 2010/0142296 | A1 | 6/2010 | You |
| 2010/0164572 | A1 | 7/2010 | Kim |
| 2012/0194233 | A1 | 8/2012 | Kim et al. |

FOREIGN PATENT DOCUMENTS

| | | |
|---|---|---|
| JP | 2011-205165 | 10/2011 |
| KR | 1020050058918 A | 6/2005 |

* cited by examiner

*Primary Examiner* — James G Norman
(74) *Attorney, Agent, or Firm* — Volentine & Whitt, PLLC

(57) ABSTRACT

A clock synchronization circuit includes a delay-locked loop (DLL) and a delay-locked control unit. The DLL is configured to generate an output clock signal by delaying an input clock signal by a delay time, and to execute a delay-locking operation in which the delay time is adjusted to a locked state according to a comparison between the output clock signal and the input clock signal. The delay-locked control unit configured to detect the locked state of the DLL, and to control the DLL based on the determined locked state.

11 Claims, 15 Drawing Sheets

CLOCK SYNCHRONIZATION CIRCUIT AND SEMICONDUCTOR MEMORY DEVICE INCLUDING CLOCK SYNCHRONIZATION CIRCUIT

CROSS-REFERENCE TO RELATED APPLICATIONS

A claim of priority is made to U.S. Provisional Patent Application No. 61/812,772, filed on Apr. 17, 2013, in the U.S. Patent and Trademark Office, and Korean Patent Application No. 10-2013-0111935, filed on Sep. 17, 2013, in the Korean Intellectual Property Office, the disclosures of which are incorporated herein in their entireties by reference.

BACKGROUND

The inventive concept generally relates to semiconductor circuits, and more particularly, to clock synchronization circuits which include a delay-locked loop (DLL) and to semiconductor memory devices including clock synchronization circuits which include a DLL.

In order to avoid degradation of high-frequency performance, a semiconductor device that operates at a high frequency, such as a semiconductor memory device, requires a circuit that is effective in accurately synchronizing a phase of an internal clock signal with a phase of an external clock signal. To this end, a delay-locked loop (DLL) is generally used. The DLL operates by delaying the external clock signal by a delay time to generate the internal clock signal, and by feeding back the generated internal clock signal to adjust the delay time so as reduce a phase difference between the internal clock signal and the external clock signal.

SUMMARY

According to an aspect of the inventive concepts, a clock synchronization circuit is provided which includes a delay-locked loop (DLL) and a delay-locked control unit. The DLL is configured to generate an output clock signal by delaying an input clock signal by a delay time, and to execute a delay-locking operation in which the delay time is adjusted to a locked state according to a comparison between the output clock signal and the input clock signal. The delay-locked control unit is configured to detect the locked state of the DLL, and to generate a delay-locked disable signal when the locked state is detected as being maintained for a predetermined period of time, where the DLL is responsive to the delay-locked disable signal to terminate the delay-locking operation.

When the delay-locking operation is terminated, the delay-locked control unit may terminate the detected locked state of the DLL.

The predetermined period of time may be set according to an external setting signal. Alternately, the predetermined period of time is set according to a phase difference between the input clock signal and the output clock signal in the locked state.

The delay-locked control unit may include a locked detector that determines whether the DLL is in the locked state, and outputs a delay-locked signal, and a counter that counts a time in which the locked state is maintained based on the delay-locked signal to obtain a count value, and to output the delay-locked disable signal when the count value is equal to or greater than a predetermined value. The counter may count the input clock signal when the delay-locked signal has a first logic level, and the counter may be reset when the delay-locked signal has a second logic level.

The DLL may include a phase detector configured to generate an up-down signal based on a phase difference between the input clock signal and the output clock signal, a delay controller configured to output a delay control signal for adjusting the delay time in response to the up-down signal, and a delay line configured to delay the input clock signal according to the delay control signal. The locked detector may be configured to receive the up-down signal, and determine whether the DLL is in the locked state based on a number of repetitions of an up state or a down state of the up-down signal. Alternately, the locked detector may be configured to whether the DLL is locked based on the phase difference between the input clock signal and the output clock signal. Also alternatively, the locked detector may be configured to determine whether the DLL is locked based on a change value of the delay control signal.

The DLL may further include a first clock buffer that buffers a received clock signal, and generates a first clock signal that is applied as a reference clock signal of the delay controller and the locked detector, a second clock buffer that buffers the received clock signal, and generates the input clock signal that is applied to the delay line, a third clock buffer that buffers an output of the delay line, and generates the output clock signal that is applied to the phase detector, and a fourth clock buffer that buffers the output of the delay line, and generates another output clock signal that has a same phase as the output clock signal that is applied to the phase detector, where operations of the first clock buffer and the third clock buffer are stopped in response to the delay-locked disable signal.

The DLL may further include a first clock buffer that buffers a received clock signal, and generates a first clock signal that is applied as a reference clock signal of the delay controller and the locked detector, a second clock buffer that buffers the output of the delay line, and generates second clock signal that has a same phase as the output clock signal that is applied to the phase detector, where an operation of the first clock buffer is stopped in response to the delay-locked disable signal.

The clock synchronization circuit may applied to a semiconductor device that inputs or outputs data in synchronization with an external device, where when an operational state of the semiconductor device is changed, the delay-locking operation of the DLL is performed.

According to another aspect of the inventive concepts, a clock synchronization circuit is provided which includes a delay locked loop (DLL), and a control circuit configured to disable a delay-locking operation of the DLL upon detecting a locked state of the delay-locking operation of the DLL for at least a predetermined period of time.

The DLL may be configured to delay an input clock signal by a delay time and output a resultant delayed signal as an output clock signal, and the delay-locking operation of the DLL may include comparing the output clock signal with the input clock signal, and adjusting the delay time according to a comparison result.

The control circuit may be configured to monitor the delay-locking operation to determine whether the delay time has been locked for the predetermined period of time, and to disable the delay-lock operation when it is determined that the delay time has been locked for the predetermined period of time.

The DLL may include a delay line configured to delay an input clock signal by a delay time and output a resultant delayed signal as an output clock signal, a phase-detector configured to generate an up-down signal having a first state when a phase of the input clock signal is in advance of a phase of the output clock signal, and having a second state when the phase of the input clock signal trails the phase of the output clock signal, a delay controller configured to adjust the delay time of the delay line in accordance whether the up-down signal is in the first state or the second state.

The control circuit may be configured to monitor at least one of an output of the phase-detector and an output of the delay controller to detect the locked state of the delay-locking operation of the DLL.

According to yet another aspect of the inventive concepts, a semiconductor memory device is provided which includes an array of memory cells, a delay-locked loop (DLL), a delay-locked control circuit, and a data output unit. The DLL is configured to generate an output clock signal by delaying an input clock signal by a delay time, and to execute a delay-locking operation in which the delay time is adjusted to a locked state according to a comparison between the output clock signal and the input clock signal. The delay-locked control unit is configured to detect the locked state of the DLL, and to control the DLL based on the determined locked state. The data output unit is configured to output data that is stored in the array of memory cells, based on the output clock signal.

The delay-locked control unit may include a locked detector that determines whether the DLL is in the locked state, and outputs a delay-locked signal, and a counter that counts a time in which the locked state is maintained based on the delay-locked signal to obtain a count value, and to output the delay-locked disable signal when the count value is equal to or greater than a predetermined value.

Respective operations of the DLL and the delay-locked control unit may be reset when an operational state of the semiconductor memory device is changed.

BRIEF DESCRIPTION OF THE DRAWINGS

Exemplary embodiments of the inventive concept will become readily understood from the detailed description that follows, with reference to the accompanying drawings, in which.

DETAILED DESCRIPTION OF THE EMBODIMENTS

Figure 1:
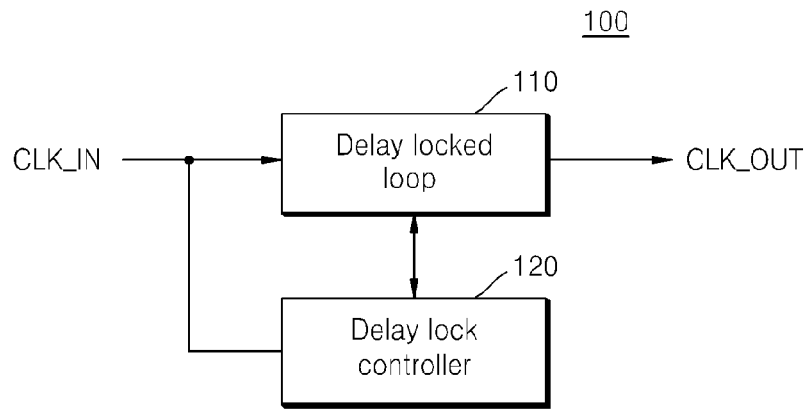
FIG. 1 is a block diagram illustrating a clock synchronization circuit according to embodiments of the inventive concept.

The inventive concept will now be described more fully with reference to the accompanying drawings, in which exemplary embodiments of the inventive concept are shown. It should be understood, however, that there is no intent to limit exemplary embodiments of the inventive concept to the particular forms disclosed, but conversely, exemplary embodiments of the inventive concept are to cover all modifications, equivalents, and alternatives falling within the spirit and scope of the inventive concept. Like reference numerals denote like elements in the drawings. In the attached drawings, sizes of structures are exaggerated for clarity.

As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of exemplary embodiments of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a clock synchronization circuit 100 according to embodiments of the inventive concept. Generally, the clock synchronization circuit 100 operates to receive an input clock signal CLK_IN and generate an output clock signal CLK_OUT that is synchronized with the input clock signal CLK_IN. Referring to FIG. 1, the clock synchronization circuit 100 includes a delay-locked loop (DLL) 110 and a delay-locked control unit 120.

The DLL 110 generates the output clock signal CLK_OUT by delaying the input clock signal CLK_IN by a delay time. The DLL 110 may perform a delay-locking operation to obtain a locked state in which a phase difference between the input clock signal CLK_IN and the output clock signal CLK_OUT is less than a predetermined value. Here, the delay-locking operation refers to an operation of obtaining the locked state by feeding back the generated output clock signal CLK_OUT, comparing the output clock signal CLK_OUT with the input clock signal CLK_IN, and adjusting the delay time based on a comparison result. The delay-locking operation may also be referred to as a DLL updating operation, and the two terms may be used interchangeably herein.

The delay-locked control unit 120 determines a locked state of the DLL 110, and finishes the delay-locking operation of the DLL 110 when the locked state is maintained for a predetermined period of time or more. Furthermore, an operation of the delay-locked control unit 120 may also be finished. Since the delay-locking operation is finished, the DLL 110 maintains the delay time that is set before the delay-locking operation is finished. The predetermined period of time that is a period of time for which an environment where the output clock signal CLK_OUT is used is expected to be sufficiently stable may be set based on an external setting signal or the phase difference between the input clock signal CLK_IN and the output clock signal CLK_OUT in the locked state. The predetermined period of time may vary according to a specific environment, for example, a voltage and a temperature, in order to stabilize an operation of the DLL 110. For example, the predetermined period of time may be set to be a time tCLK of tens to hundreds of cycles of the input clock signal CLK_IN.

As described above, the clock synchronization circuit 100 of FIG. 1 finishes the delay-locking operation when the locked state of the DLL 110 is maintained for the predetermined period of time or more. In an environment where the locked state is maintained for a sufficient period of time, the possibility that the input clock signal CLK_IN or the output clock signal CLK_OUT is suddenly changed is low. When the delay-locking operation is continuously performed in this environment, current is unnecessarily consumed. In this case, current consumption may be reduced by finishing the delay-locking operation. The clock synchronization circuit 100 of FIG. 1 will now be explained in detail.

Figure 2:
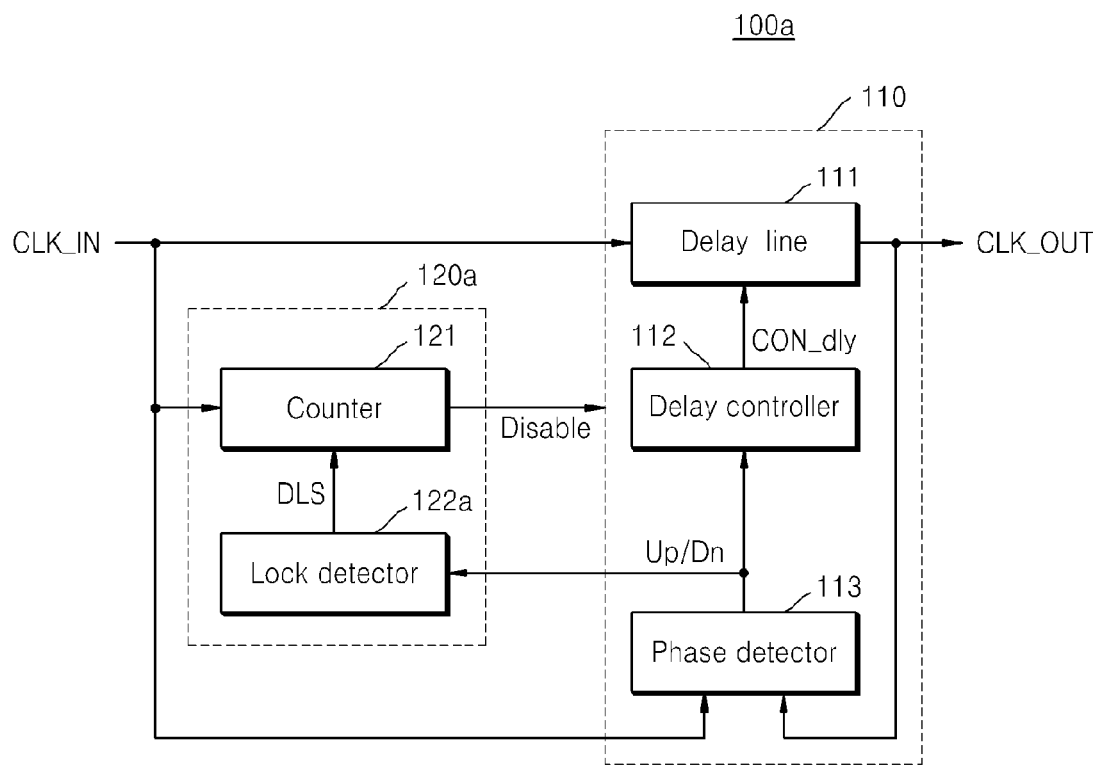
FIG. 2 is a block diagram illustrating a modification of the clock synchronization circuit of FIG. 1 according to an embodiment of the inventive concept.
Figure 3:
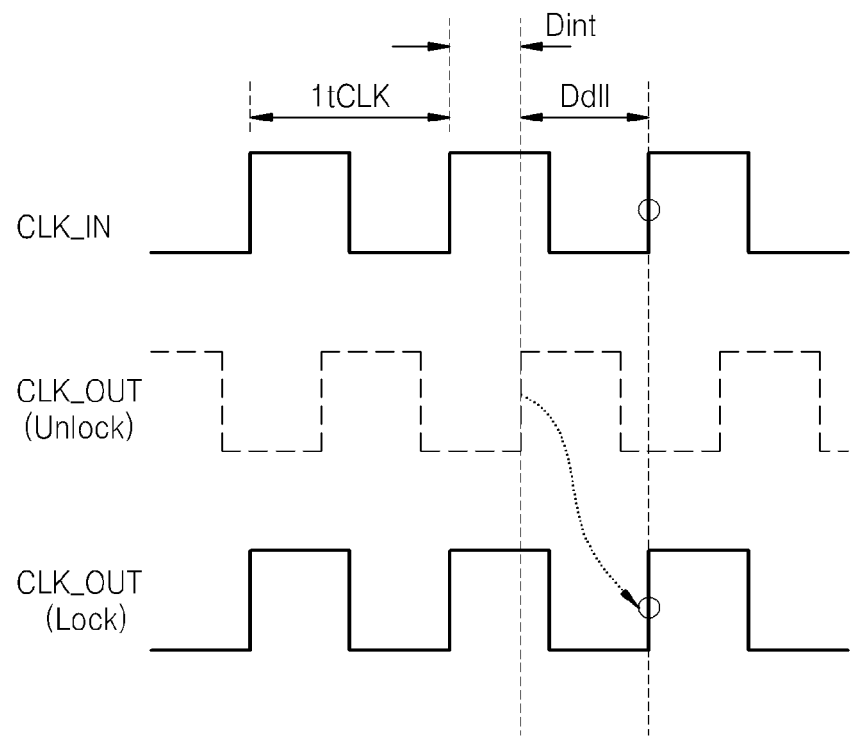
FIG. 3 is a timing diagram illustrating an input clock signal and an output clock signal according to an operational example of the clock synchronization circuit of FIG. 2.
Figure 4:
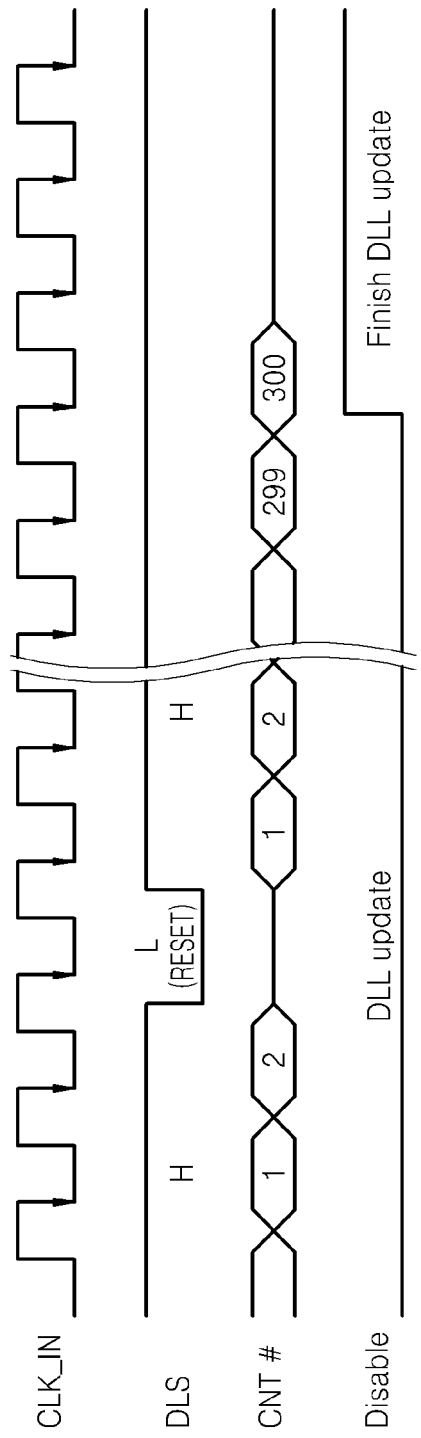
FIG. 4 is a timing diagram illustrating an example of a delay-locked control unit of FIG. 2.

FIG. 2 is a block diagram illustrating a clock synchronization circuit 100a that is an example of a modification of the clock synchronization circuit 100 of FIG. 1. FIG. 3 is a timing diagram illustrating an input clock signal and an output clock signal according to an operational example of the clock synchronization circuit 100a of FIG. 2. FIG. 4 is a timing diagram illustrating an operational example of the delay-locked control unit 120a of FIG. 2.

Referring to FIG. 2, the clock synchronization circuit 100a includes a DLL 110 and a delay-locked control unit 120a.

The DLL 110 may include a phase detector 113, a delay controller 112, and a delay line 111. The phase detector 113 may detect a phase difference by comparing the input clock signal CLK_IN and the output clock signal CLK_OUT, and may provide the phase difference to the delay controller 112. The phase difference may be output as an up-down signal Up/Dn. For example, the phase difference may be a value obtained after latching the input clock signal CLK_IN at a rising edge or a falling edge of the output clock signal CLK_OUT. The value obtained after latching the input clock signal CLK_IN at the rising edge of the output clock signal CLK_OUT may depend whether a phase of the output clock signal CLK_OUT is later (in time) than a phase of the input clock signal CLK_IN. For example, if the value is a first logic level, for example, a logic high level, this may mean that a phase of the output clock signal CLK_OUT is later than a phase of the input clock signal CLK_IN, and the phase difference may be output as a down signal Dn for advancing the phase of the output clock signal CLK_OUT. On the other hand, for example, when the value has a second logic level, for example, a logic low level, this may mean that the phase of the output clock signal CLK_OUT is earlier than the phase of the input clock signal CLK_IN, and the phase difference may be output as an up signal Up for retarding the phase of the output clock signal CLK_OUT.

The delay controller 112 generates and outputs a delay control signal CON_dly for adjusting a delay time of the output clock signal CLK_OUT, in response to the up-down signal Up/Dn that is output from the phase detection signal 113. The delay control signal CON_dly may be an n-bit code signal. When the up signal Up is received from the phase detector 113, a value of the delay control signal CON_dly may be increased. When the down signal Dn is received from the phase detector 113, the value of the delay control signal CON_dly may be reduced. For example, assuming that the delay control signal CON_dly is a 4-bit delay control code signal, when a value of the delay control signal CON_dly is '0 0 0 0', the input clock signal CLK_IN may not be delayed at all and may be output as the output clock signal CLK_OUT. As the value of the delay control signal CON_dly is increased in an order of '0 0 0 1', '0 0 1 0', '0 0 1 1', . . . , the input clock signal CLK_IN may be set to be further delayed and output. In this case, an initial value may be an intermediate value such as '0 1 1 0', and a value may be sequentially increased whenever the up signal Up is received from the phase detector 113 and may be sequentially reduced whenever the down signal Dn is received from the phase detector 113.

The delay line 111 delays and outputs the input clock signal CLK_IN. A clock signal output from the delay line 111 may be the output clock signal CLK_OUT. In this case, a delay time may be adjusted according to the delay control signal CON_dly. For example, the delay time may be increased or reduced according to a change in a value of the delay control signal CON_dly. As described above, the delay control signal CON_dly may be an n-bit code signal, and a delay time may be increased as the code value is increased and may be reduced as the code value is reduced.

As shown in FIG. 2, the phase detector 113, the delay controller 112, and the delay line 111 may form a feedback circuit, and may lock the input clock signal CLK_IN and the output clock signal CLK_OUT by feeding back the output clock signal CLK_OUT and adjusting a delay time according to a result of comparison between the input clock signal CLK_IN and the output clock signal CLK_OUT. Referring to FIG. 3, the output clock signal CLK_OUT in an unlocked state may be later than the input clock signal CLK_IN, and in this case, a delay Dint may occur due to an internal factor, for example, a load of the output clock signal CLK_OUT, of the clock synchronization circuit 100a or an integrated circuit (not shown) using the clock synchronization circuit 100a. The DLL 110 may lock the input clock signal CLK_IN and the output clock signal CLK_OUT by performing a delay-locking operation. The DLL 110 may synchronize the output clock signal CLK_OUT with the input clock signal CLK_IN by further delaying the output clock signal CLK_OUT. In this case, a delay time Ddll that is generated due to the DLL 110 may be within one cycle 1 tCLK, and thus the output clock signal CLK_OUT may be delayed by one cycle 1 tCLK from the input clock signal CLK_IN so that the input clock signal CLK_IN and the output clock signal CLK_OUT may be synchronized with each other.

Referring back to FIG. 2, the delay-locked control unit 120a includes a locked detector 122a and a counter 121. The delay-locked control unit 120a determines a locked state of the DLL 110, and finishes the delay-locking operation of the DLL 110 when the locked state is maintained for a predetermined period of time or more.

The locked detector 122a determines whether the DLL 110 is locked and outputs a delay-locked signal DLS. The locked detector 122a may receive the up-down signal Up/Dn, and may determine whether the DLL 110 is locked based on the number of repetitions of the up signal Up or the down signal Dn of the up-down signal Up/Dn. For example, when the up signal Up or the down signal Dn is not continuously repeated a predetermined number of times or more, the locked detector 122a may determine that the DLL 110 is locked and may output the delay-locked signal DLS having a first logic level, for example, a logic high level. By contrast, when the up signal Up or the down signal Dn is continuously repeated the predetermined number of times or more, the locked detector 122a may determine that the DLL 110 is not locked and may output the delay-locked signal DLS having a second logic level, for example, a logic low level.

The counter 121 counts a time for which the locked state is maintained based on the delay-locked signal DLS to obtain a counting value, and when the counting value is greater than a predetermined value, that is, when the locked state is maintained for a predetermined period of time, outputs a delay-locked disable signal Disable. For example, when the delay-locked signal DLS has the first logic level, the counter 121 may count the input clock signal CLK_IN, and when the counting value is equal to or greater than the predetermined value, may output the delay-locked disable signal Disable. In this case, when the delay-locked signal DLS has the second logic level, the counter 121 may be reset.

A more detailed explanation will be made as follows with reference to FIG. 4. When the input clock signal CLK_IN is applied as shown in FIG. 4 and the delay-locked signal DLS output from the locked detector 122a has a first logic level, for example, a logic high level, the counter 121 may count the input clock signal CLK_IN. As shown in FIG. 4, a value may be counted at every rising edge (or every falling edge) of the input clock signal CLK_IN. In this case, when the delay-locked signal DLS has a second logic level, for example, a logic low level, the counter 121 is reset and is stopped a counting operation. When the delay-locked signal DLS returns to a logic high level, the counter 121 may resume the counting operation. When the delay-locked signal DLS is maintained at the logic high level and a counting value is equal to or greater than a predetermined value, for example, 300, the counter 121 may output the delay-locked disable signal Disable having a first logic level. The delay-locked disable signal Disable may be applied to the DLL 110, to finish a DLL updating operation. Before the delay-locked disable signal Disable is output, for example, when the delay-locked disable signal Disable has a logic low level as shown in FIG. 4, the DLL updating operation may be continuously performed. When the delay-locked disable signal Disable is generated, that is, when the delay-locked disable signal Disable has a first logic level, the DLL updating operation may be finished. When the delay-locked disable signal Disable is received, operations of the phase detector 113 and the delay controller 112 of the DLL 110 are stopped, and a delay time of the delay line 111 before the delay-locking operation is finished, that is, before the DLL updating operation is finished, is maintained. Furthermore, when the delay-locked disable signal Disable is output, operations of the locked detector 122a and the counter 121 of the delay-locked control unit 120 may be stopped. Accordingly, operations of elements of the clock synchronization circuit 100a other than the delay line 111 may be stopped, thereby reducing current consumption.

Figure 5:
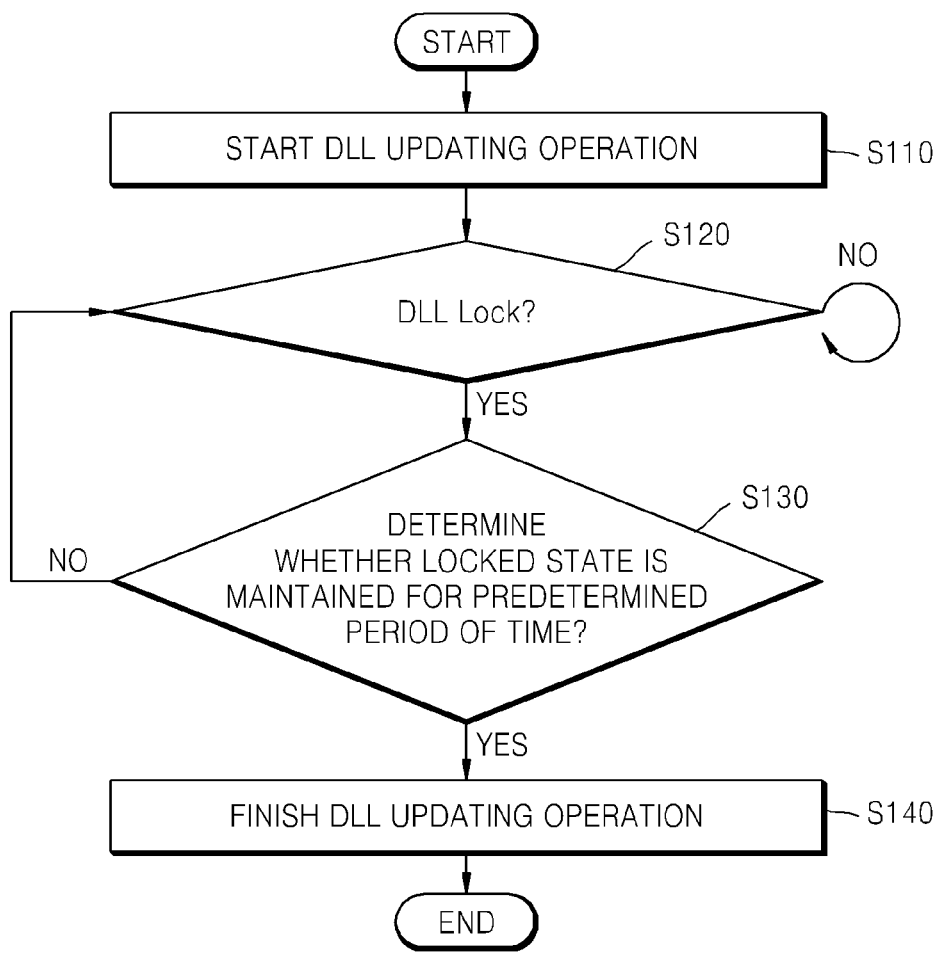
FIG. 5 is a flowchart for reference in describing an operational example of the clock synchronization circuit of FIG. 2.

FIG. 5 is a flowchart illustrating an operational example of the clock synchronization circuit 100a of FIG. 2.

Referring to FIG. 5, in operation S110, a DLL updating operation of updating the DLL 110 is started. Next, in operation S120, it is determined whether the DLL 110 is locked. As described with reference to FIG. 2, the locked detector 122a may determine whether the DLL 110 is locked and may output the delay-locked signal DLS. In this case, when the locked detector 122a determines that the DLL 110 is not locked in operation S120, the DLL updating operation and an operation of determining whether the DLL 110 is locked are repeatedly performed.

When the locked detector 122a determines that the DLL 110 is locked in operation S120, the operation proceeds to operation S130. In operation S130, it is determined whether a locked state is maintained for a predetermined period of time. For example, the counter 121 may perform a counting operation when the delay-locked signal DLS output from the locked detector 122a has a first logic level and the counter 121 is reset when the delay-locked signal DLS output from the locked detector 122a has a second logic level, in order to determine whether the locked state is maintained for the predetermined period of time. When it is determined that the locked state is not maintained for the predetermined period of time in operation S130, the DLL updating operation and the operation of determining whether the DLL 110 is locked are repeatedly performed. When it is determined that the locked state is maintained for the predetermined period of time in operation S130, the DLL updating operation is stopped. For example, when a counting value of the counter 121 is equal to or greater than a predetermined value, the counter 121 may output the delay-locked disable signal Disable, the DLL updating operation, that is, the delay-locking operation, may be finished in response to the delay-locked disable signal Disable, and an operation of the delay-locked control unit 120a may also be finished.

Operation S110 in which an overall operation of the clock synchronization circuit 100a, or the DLL updating operation is started may be performed whenever an operational state (or an operation mode) of a semiconductor device to which the lock synchronization circuit 100a is applied is changed. For example, an operational state of a dynamic random-access memory (DRAM) device including the lock synchronization circuit 100a may be divided into an idle state, an active-precharge state, a power-down state, or etc. When the operational state is changed, the DLL updating operation is necessary according to a change in a delay time. Accordingly, even after the DLL updating operation is finished, when the operational state of the DRAM device is changed, the clock synchronization circuit 100a may lock the DLL 110 by resuming the DLL updating operation. Operations S120 and S130 in which it is determined whether the locked state is maintained for the predetermined period of time and operation S140 in which, the DLL updating operation is finished may be performed selectively or during the entire operation according to the operational state of the DRAM device.

Figure 6:
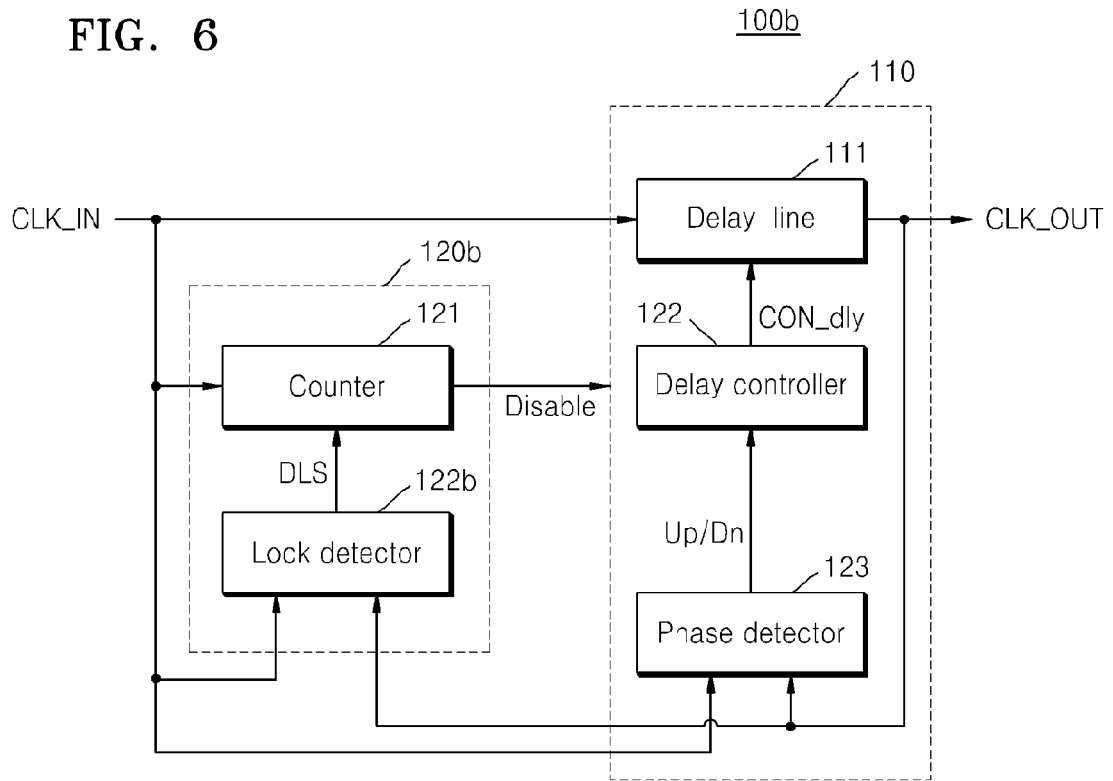
FIG. 6 is a block diagram illustrating another modification of the clock synchronization circuit of FIG. 1 according to an embodiment of the inventive concept.

FIG. 6 is a block diagram illustrating a clock synchronization circuit 100b that is an example of another modification of the clock synchronization circuit 100 of FIG. 1 or the clock synchronization circuit 100a of FIG. 2.

Referring to FIG. 6, the clock synchronization circuit 100b may include the DLL 110 and a delay-locked control unit 120b, the DLL 110 may include the delay line 111, the delay controller 112, and the phase detector 113, and the delay-locked control unit 120b may include a locked detector 122b and a counter 121. Elements and an operation of the clock synchronization circuit 100b of FIG. 6 are similar to those of the clock synchronization circuit 100a of FIG. 2, except for an operation of the locked detector 122b. The locked detector 122a of FIG. 2 determines whether the DLL 110 is locked based on the up-down signal Up/Dn that is output from the phase detector 113. However, the locked detector 122b of FIG. 6 may determine whether the DLL 110 is locked by receiving the input clock signal CLK_IN and the output clock signal CLK_OUT and comparing the input clock signal CLK_IN with the output clock signal CLK_OUT. The locked detector 122b may determine that the DLL 110 is locked when a phase difference between the input clock signal CLK_IN and the output clock signal CLK_OUT is equal to or less than a preset critical value. Operations of other elements and an operation of the clock synchronization circuit 100b are the same as those described with reference to FIG. 2, and thus a repeated explanation thereof will not be given.

Figure 7:
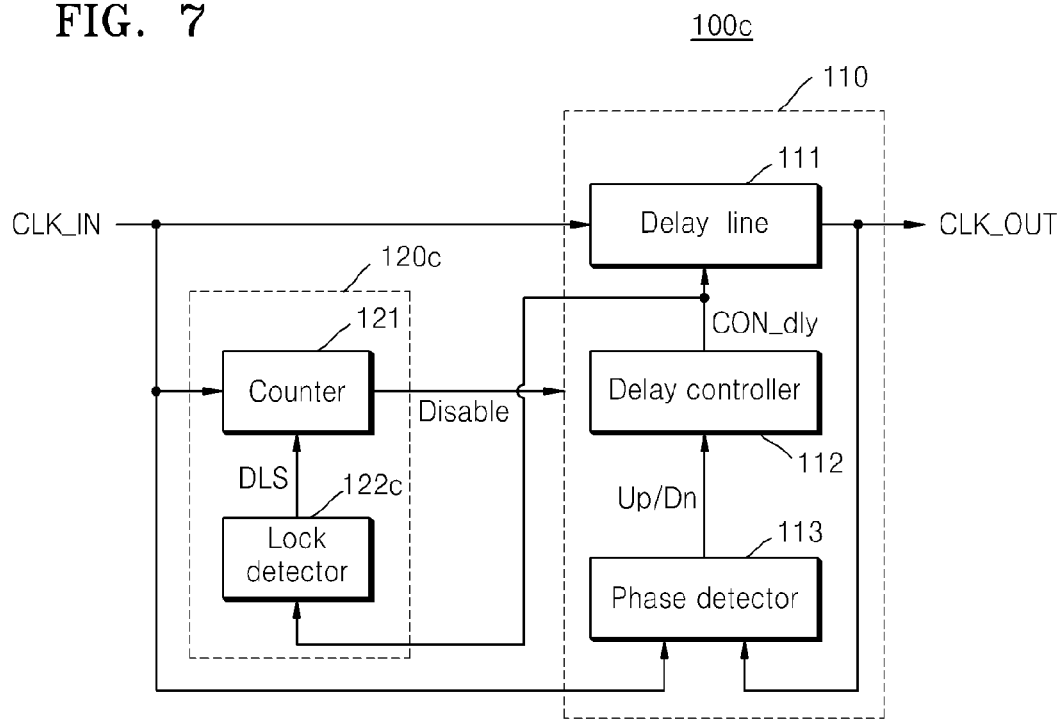
FIG. 7 is a block diagram illustrating another modification of the clock synchronization circuit of FIG. 1 according to an embodiment of the inventive concept.

FIG. 7 is a block diagram illustrating a clock synchronization circuit 100c that is another example of a modification of the clock synchronization circuit 100 of FIG. 1 or the clock synchronization circuit 100a of FIG. 2.

Referring to FIG. 7, the clock synchronization circuit 100c may include the DLL 110 and a delay-locked control unit 120c, the DLL 110 may include the delay line 111, the delay controller 112, and the phase detector 113, and the delay-locked control unit 120c may include a locked detector 122c and the counter 121. Elements and an operation of the clock synchronization circuit 110c of FIG. 7 are similar to those of the clock synchronization circuit 100b of FIG. 6, except for an operation of the locked detector 122c. The locked detector 122c of FIG. 7 may determine whether the DLL 110 is locked based on the delay control signal CON_dly that is generated by the delay controller 112. The locked detector 122c may determine whether the DLL 110 is locked according to a direction in which a data value of the delay control signal CON_dly is changed. For example, when the data value of the delay control signal CON_dly is increased or reduced and thus a change in a delay time is continuously required, the locked detector 122c may determine that the DLL 110 is not locked. When the data value of the delay control signal CON_dly is repeatedly increased and reduced or there is no change in the data value of the delay control signal CON_dly and thus a change in the delay time is not required due to a low phase difference between the input clock signal CLK_IN and the output clock signal CLK_OUT, the locked detector 122c may determine that the DLL 110 is locked. The locked detector 122c of FIG. 7 may determine whether the DLL 110 is locked based on the delay control signal CON_dly as described above. Operations of other elements and an operation of the clock synchronization circuit are the same as those described with reference to FIG. 2, and thus a repeated explanation thereof will not be given.

Figure 8A:
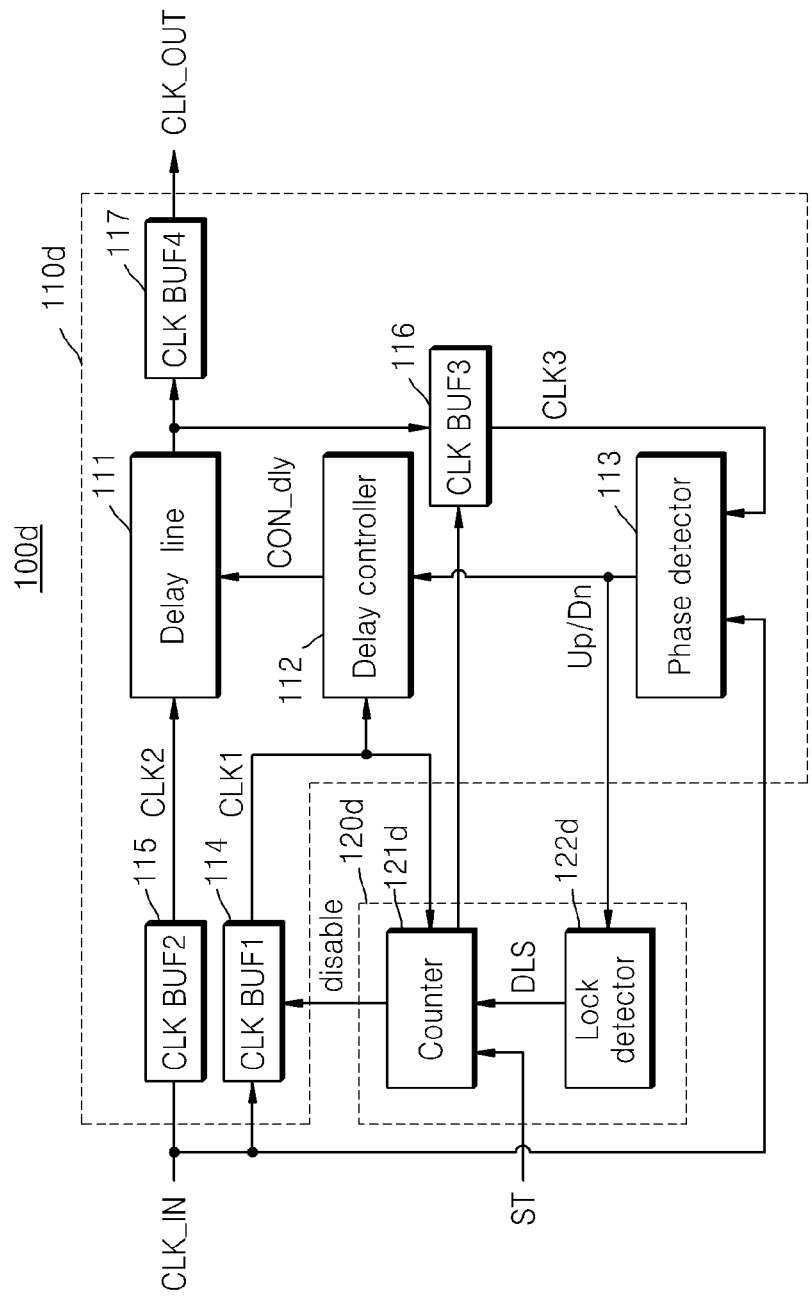
FIGS. 8A and 8B are block diagrams illustrating other modifications of the clock synchronization circuit of FIG. 1 according to an embodiment of the inventive concept.
Figure 8B:
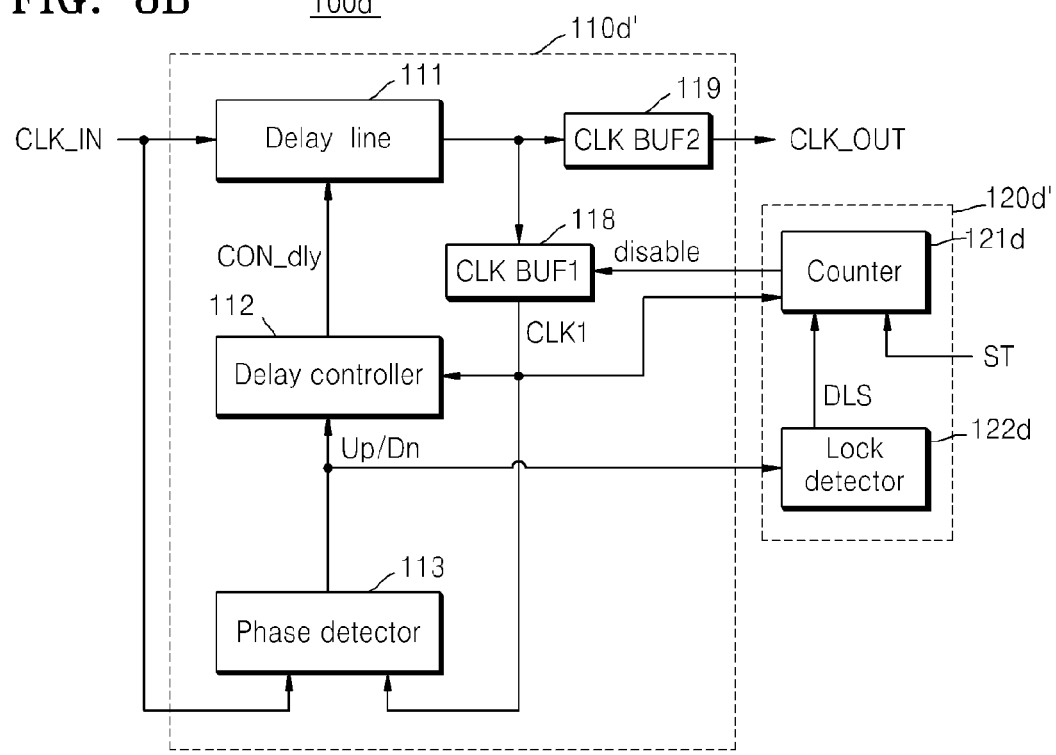

FIGS. 8A and 8B are block diagrams illustrating clock synchronization circuits 100d and 100d' that are other examples of modifications of the clock synchronization circuit 100 of FIG. 1. Referring to FIGS. 8A and 8B, first through fourth clock buffers 114, 115, 116, and 117, and first and second clock buffers 118, and 119 are provided and when locked states of DLLs 110d and 110d' are maintained for a predetermined period of time or more, a delay-locking operation may be finished by finishing an operation of at least one of the first through fourth clock buffers 114, 115, 116, and 117 and the first and second clock buffers 118, and 119 that are used for buffering.

Referring to FIG. 8A, the clock synchronization circuit 100d includes the DLL 110d and a delay-locked control unit 120d.

The DLL 110d may include the delay controller 112, the phase detector 113, and the first through fourth clock buffers 114, 115, 116, and 117, may generate the output clock signal CLK_OUT by delaying the input clock signal CLK_IN, and may lock the input clock signal CLK_IN and the output clock signal CLK_OUT by performing a delay-locking operation.

An operation of the DLL 110d is similar to that of the DLL 110 described with reference to FIG. 2. As described with reference to FIG. 2, the DLL 110d generates the output clock signal CLK_OUT by delaying the input clock signal CLK_IN, and locks the input clock signal CLK_IN and the output clock signal CLK_OUT by performing the delay-locking operation. When the delay-locked disable signal Disable is applied from the delay-locked control unit 120d, the delay-locking operation is finished.

However, the DLL 110d of FIG. 8A may further include the first clock buffer 114 and the second clock buffer 115 that buffer the input clock signal CLK_IN and the third clock buffer 116 and the fourth clock buffer 117 that buffer an output of the delay line 111, that is, the delay clock signal CLK_dly, and may operate by using a first clock signal CLK1 and a second clock signal CLK2 that are generated by buffering the input clock signal CLK_IN and a third clock signal CLK3 that is generated by buffering the delay clock signal CLK_dly. In this case, it may be assumed that the third clock buffer 116 and the fourth clock buffer 117 have the same phase delay characteristics. Accordingly, the output clock signal CLK_OUT and the third clock signal CLK3 may have substantially the same phase. When the delay-locked disable signal Disable is received from the delay-locked control unit 120d, operations of the first clock buffer 114 and the third clock buffer 116 may be finished, and thus the first clock signal CLK1 and the third clock signal CLK3 may not be generated, thereby finishing the delay-locking operation which will be explained in detail as follows.

The first clock buffer 114 generates the first clock signal CLK1 by buffering the input clock signal CLK_IN, and the second clock buffer 115 generates the second clock signal CLK2 by buffering the input clock signal CLK_IN.

The first clock signal CLK1 may be applied to the delay controller 112, and also to a counter 121d of the delay-locked control unit 120d. An operation of the first clock buffer 114 may be finished in response to the delay-locked disable signal Disable. Accordingly, the first clock signal CLK1 is not generated.

The second clock signal CLK2 may be applied to the delay line 111. The delay line 111 may generate the delay clock signal CLK_dly by delaying the second clock signal CLK2.

The third clock buffer 116 generates the third clock signal CLK3 by buffering the delay clock signal CLK_dly that is output from the delay line 111, and the fourth clock 114 generates the output clock signal CLK_OUT by buffering the delay clock signal CLK_dly. As described above, the third clock buffer 116 and the fourth clock buffer 117 may have the same phase characteristics or may be the same buffer. Accordingly, the third clock signal CLK3 and the output clock signal CLK_OUT may have the same phase.

The third clock signal CLK3 may be applied to the phase detector 113. An operation of the third clock buffer 116 may be finished in response to the delay-locked disable signal Disable. Accordingly, the third clock signal CLK3 is not generated.

The phase detector 113 detects a phase difference between the third clock signal CLK3 and the input clock signal CLK_IN and generates the up-down signal Up/Dn as a result of the detection.

The delay controller 112 generates the delay control signal CON_dly for adjusting a delay time of the delay line 111 according to the up-down signal Up/Dn. In this case, the delay controller 112 may operate based on the first clock signal CLK1. For example, when the delay control signal CON_dly is changed, a data value of the delay control signal CON_dly may be output at a rising edge or a falling edge of the first clock signal CLK1.

The delay line 111 may generate the delay clock signal CLK_dly by delaying the second clock signal CLK2, and in this case, the delay time may be adjusted in response to the delay control signal CON_dly.

The delay-locked control unit 120d includes a locked detector 122d and the counter 121d, determines a locked state of the DLL 110d, and finishes the delay-locking operation of the DLL 110d when the locked state is maintained for a predetermined period of time or more.

The locked detector 122d determines whether the DLL 110d is locked and outputs the delay-locked signal DLS. The locked detector 122d may receive the up-down signal Up/Dn from the phase detector 113, and may determine whether the DLL 110d is locked based on the number of repetitions of the up signal Up or the down signal Dn of the up-down signal Up/Dn. For example, when the up signal Up or the down signal Dn is not repeated a predetermined number of times or more, the locked detector 122d may determine that the DLL 110d is locked and may output the delay-locked signal DLS having a first logic level, for example, a logic high level. By contrast, when the up signal Up or the down signal Dn is repeated the predetermined number of times or more, the locked detector 122d may determine that the DLL 110d is not locked and may output the delay-locked signal DLS having a second logic level, for example, a logic low level.

The counter 121d may receive the first clock signal CLK1 from the first clock buffer 114 and may operate in response to the delay-locked signal DLS and a state change signal ST. The counter 121d outputs the delay-locked disable signal Disable when the locked state of the DLL 110d is delayed by a predetermined period of time or more. When the delay-locked signal DLS has a first logic level, the counter 121d may count the first clock signal CLK1 and may determine a time for which the locked state of the DLL 110d is maintained according to a counting value. When the delay-locked signal DLS has a second logic level, the counter 121 may be reset to stop a counting operation, and then, when the delay-locked signal DLS returns to a first logic level, the counter 121 may resume the counting operation. When the counting value is equal to or greater than a predetermined value, that is, when the locked state is maintained for the predetermined period of time, the counter 121d outputs the delay-locked disable signal Disable.

As described above, operations of the first clock buffer 114 and the third clock buffer CLK3 are finished in response to the delay-locked disable signal Disable. Accordingly, when the delay-locked disable signal Disable is generated, the first clock signal CLK1 and the third clock signal CLK3 are not generated. When the first clock signal CLK1 and the third clock signal CLK3 are not generated, operations of the detector 122d of the counter 121d and the delay controller 112 using the first clock signal CLK1 are stopped and an operation of the phase detector 113 using the third clock signal CLK3 is stopped, thereby reducing current consumption.

In this case, since a value of the delay control signal CON_dly that is output from the delay controller 112 is maintained, the delay control signal CON_dly is applied to the delay line 111, and the delay line 111 operates based on the second clock signal CLK2, the output clock signal CLK_OUT is generated in a state where an existing delay time is maintained.

When the state change signal ST is applied from an external device, for example, a system control unit (not shown), the counter 121d is reset. As the counter 121d is reset, the generation of the delay-locked disable signal Disable is stopped. When the generation of the delay-locked disable signal Disable is stopped, it means that the delay-locked disable signal Disable has a second logic level, for example, a logic low level. Accordingly, the first clock buffer 114 may operate to generate the first clock signal CLK1, the DLL 110d may perform the delay-locking operation, and the delay-locked detector 120d may also operate.

FIG. 8B is a modification of FIG. 8A. In FIG. 8B, like in FIG. 8A, the first and second clock buffers 118 and 119 are provided, and an operation of at least one of the first and second clock buffers 118 and 119 is finished when a locked state is maintained for a predetermined period of time, to finish a delay-locking operation.

Referring to FIG. 8B, the lock synchronization circuit 100d' includes a DLL 110d' and a delay-locked control unit 120d'.

The DLL 110d' may include the delay line 111, the delay controller 112, the phase detector 113, and the first and second clock buffers 118 and 119, may generate the output clock signal CLK_OUT by delaying the input clock signal CLK_IN, and may lock the input clock signal CLK_IN and the output clock signal CLK_OUT by performing a delay-locking operation.

The delay-locked control unit 120d' includes the locked detector 122d and the counter 121d, determines a locked state of the DLL 110d', and finishes the delay-locking operation of the DLL 110d' when the locked state is maintained for a predetermined period of time or more.

Operations of the DLL 110d' and the delay-locked control unit 120d' are similar to those of the DLL 110d and the delay-locked control unit 120d of FIG. 8A. In FIG. 8A, the input clock signal CLK_IN is buffered by the first and second clock buffers 114 and 115, and the output first and second clock signals CLK1 and CLK2 are used to operate the clock synchronization circuit 100d. However, in the DLL 110d' of FIG. 8B, the input clock signal CLK_IN is applied to the delay line 111 without being buffered, and the delay clock signal CLK_dly that is delayed by and output from the delay line 111 is buffered and used. As shown in FIG. 8B, the first clock buffer 118 and the second clock buffer 119 respectively output the first clock signal CLK1 and the output clock signal CLK_OUT by buffering the delay clock signal CLK_dly. In this case, the first clock buffer 118 and the second clock buffer 119 may have the same phase characteristics or may be the same buffer. Accordingly, the first clock signal CLK1 and the output clock signal CLK_OUT may have substantially the same phase.

The first clock signal CLK1 is applied to the phase detector 113, the delay controller 112, and the counter 121d. Accordingly, the first clock signal CLK1 may be used for a phase detection operation and a delay control operation of the DLL 110d', and may be used for a locked state determination operation of the delay-locked control unit 120d'.

When the delay-locked disable signal Disabled is received from the delay-locked control unit 120d', an operation of the first clock buffer 118 is finished, and thus the first clock signal CLK1 is not generated. Accordingly, operations of the delay phase detector 113, the control unit 112, the counter 121d, and the locked detector 122d using the first clock signal CLK1 are stopped, and an operation of the phase detector 113 using the third clock signal CLK3 is stopped, thereby reducing current consumption. The clock synchronization circuit 100d' of the present embodiment may stop the delay-locking operation by separating a reference clock signal used by the delay line 111 and the other circuits 112, 113, 120d, and 120d' and stopping the generation of the reference clock signal, for example, the first clock signal CLK1 and the third clock signal CLK3, used by the other circuits 112, 113, 120d, and 120d' when the delay disable signal Disable is generated.

In the present embodiment, the clock buffers 114, 115, 116, 117, 118, and 119 are used in order to separate a reference clock signal used by the circuits 111, 112, 113, 121d, and 122d and selectively finish the generation of the reference clock signal. However, the present embodiment is not limited thereto. Instead of the clock buffers 114, 115, 116, 117, 118, and 119, other units such as a switch signal, a transmission gate signal, or etc that may transmit an input signal and may be turned on/off in response to a control signal may be used.

Also, although the locked detectors 122d and 122d determine whether the DLL 110d and the DLL 110d' are locked based on the up-down signal Up/Dn that is output from the phase detector 113, the present embodiment is not limited thereto, and whether the DLL 110d and the DLL 110d' are locked may be determined by directly comparing clock signals or based on the delay control signal CON_dly as described with reference to FIGS. 5 and 6.

Figure 9:
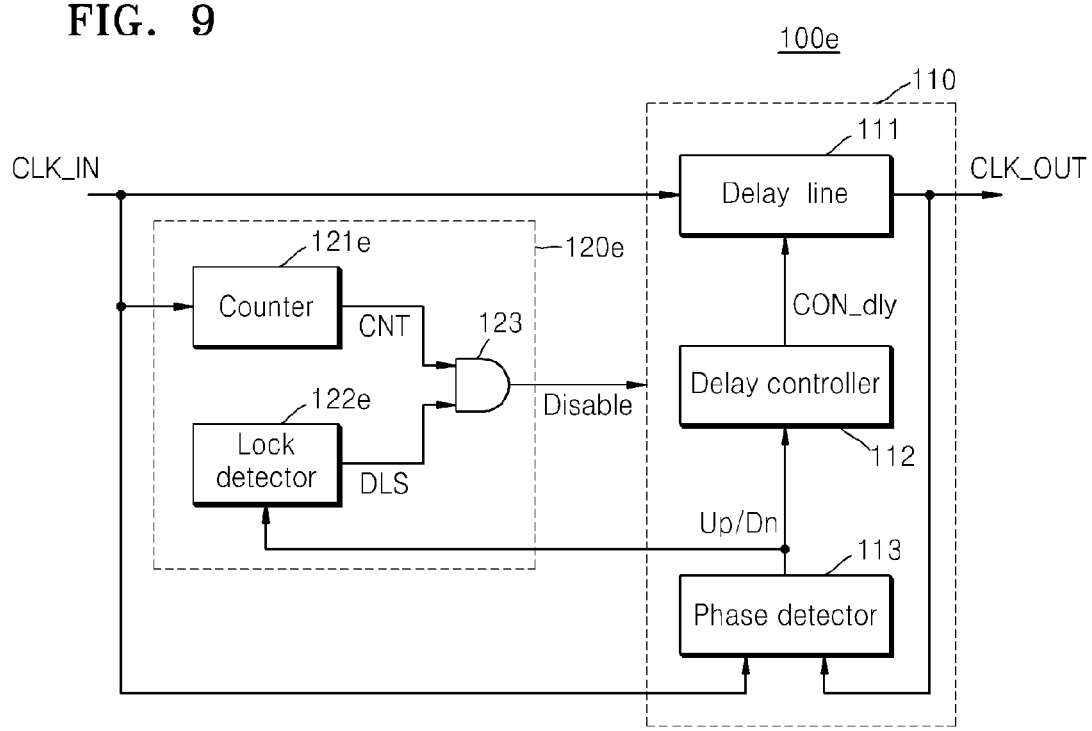
FIG. 9 is a block diagram illustrating another modification of the clock synchronization circuit of FIG. 1 according to an embodiment of the inventive concept.

FIG. 9 is a block diagram illustrating a clock synchronization circuit 100e that is a modification of the clock synchronization circuit 100 of FIG. 1.

Referring to FIG. 9, the clock synchronization circuit 100e includes the DLL 110 and a delay-locked control unit 120e. An operation of the DLL 110 is substantially the same as that of the DLL 110 of FIG. 2, and thus an explanation thereof will not be repeated.

In FIG. 9, when a predetermined period of time passes after the clock synchronization circuit 100e starts to operate, that is, after the DLL 110 starts to be updated, the locked control unit 120e may determine whether the DLL 110 is locked and may generate the delay-locked disable signal Disable. To this end, the locked control unit 120e may include a counter 121e, a locked detector 122e, and a logic gate 123.

The locked detector 122e determines whether the DLL 110 is locked and outputs the delay-locked signal DLS. In this case, the locked detector 122e may determine whether the DLL 110 is locked based on the up-down signal Up/Dn that is applied from the phase detector 113 as shown in FIG. 9. Alternatively, the locked detector 122e may determine whether the DLL 110 is locked by directly comparing the input clock signal CLK_IN and the output clock signal CLK_OUT or based on a change in a data value of the delay control signal CON_dly.

The counter 121e may count the input clock signal CLK_IN to obtain a counting value, and when the counting value is equal to or greater than a predetermined value, for example, when a preset value, the counter 121e may generate a counting signal CNT.

The logic gate 123 generates the delay-locked disable signal Disable based on the counting signal CNT and the delay-locked signal DLS. For example, when the counting signal CNT and the delay-locked signal DLS have a first logic level, for example, a logic high level, the logic gate 123 may generate the delay-locked disable signal Disable having a first logic level. Although the logic gate 128 is an AND gate in FIG. 9, the present embodiment is not limited thereto. The logic gate 128 may be modified in various ways in consideration of logic levels of the counting signal CNT and the delay-locked signal DLS according to operations of the counter 121e and the locked detector 122e.

For example, a more detailed explanation will be made as follows. When the counter 121e is set to count 300 cycles 300 tCLK of the input clock signal CLK_IN and then to generate the counting signal CNT, the delay-locked disable signal Disable may be generated according to whether the DLL 110 is locked when a time of the 300 cycles passes after the clock synchronization circuit 100e starts to operate. When the DLL 110 is locked at a point of time when the time of the 300 cycles passes, the delay-locked disable signal Disable may be generated, to finish a delay-locking operation, that is, a DLL updating operation. When the DLL 110 is not locked at the point of time when the time of the 300 cycles passes, the DLL 110 continuously performs the delay-locking operation, and thus when the DLL 110 is locked, the delay-locking operation is finished.

As described above, the clock synchronization circuit 100e of FIG. 9 may perform the delay-locking operation, that is, the DLL updating operation until a predetermined period of time passes after an operation starts, and may stop the delay-locking operation when the DLL 110 is locked after the predetermined period of time.

Figure 10:
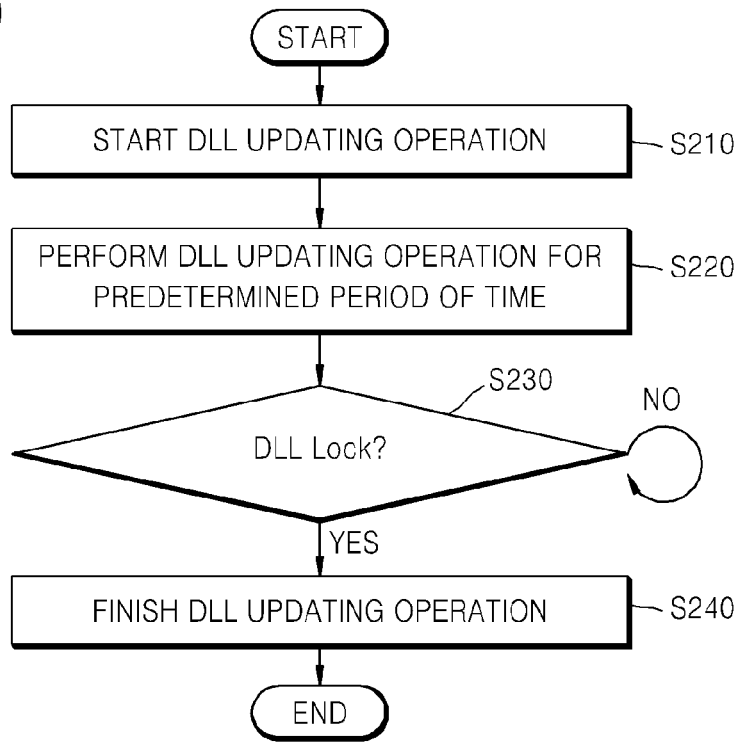
FIG. 10 is a flowchart illustrating for reference in describing an operational example of the clock synchronization circuit of FIG. 9.

FIG. 10 is a flowchart illustrating an operational example of the clock synchronization circuit 100e of FIG. 9. Referring to FIG. 10, in operation S210, the DLL 110 starts a DLL updating operation. Next, in operation S220, the DLL updating operation is performed for a predetermined period of time. The DLL updating operation may be performed irrespective of whether the DLL 110 is locked until a counting value of the counter 121e is equal to or greater than a predetermined value.

In operation S230, it is determined whether the DLL 110 is locked after the predetermined period of time. As described with reference to FIG. 9, the locked detector 122e may determine whether the DLL 110 is locked and may output a result of the determination as the delay-locked signal DLS. In this case, when it is determined that the DLL 110 is not locked in operation S230, the DLL updating operation and an operation of determining whether the DLL 110 is locked are repeatedly performed.

When it is determined that the DLL 110 is locked in operation S230, the operation proceeds to operation S240. In operation S240, the DLL updating operation is stopped. For example, when the counter 121e outputs the counting signal CNT having a first logic level after the predetermined period of time and the locked detector 122e outputs the delay-locked signal DLS having a first logic level because the DLL 110 is locked, the logic gate 123 may output the delay-locked disable signal Disable. The DLL updating operation, that is, a delay-locking operation, may be finished in response to the delay-locked disable signal Disable, and an operation of the delay-locked control unit 120e may also be finished.

Operation S210 in which an overall operation of the clock synchronization circuit 100e or the DLL updating operation is started may be performed whenever an operational state (or an operation mode) of a semiconductor device to which the clock synchronization circuit 100e is applied is changed. For example, an operational state of a DRAM device including the clock synchronization circuit 100e may be divided into an idle state, an active-precharge state, a power-down state, or etc. When the operational state is changed, the DLL updating operation is necessary according to a change in a delay time. Accordingly, when the operational state of the DRAM device is changed even after the DLL updating operation is finished, the clock synchronization circuit 100e may lock the DLL 110 by resuming the DLL updating operation. Next, operation S220 in which the DLL updating operation is performed for a predetermined period of time, operation S230 in which it is determined whether the DLL 110 is locked, and operation S240 in which the DLL updating operation is finished may be selectively or during the entire operation according to the operational state of the DRAM device.

Figure 11:
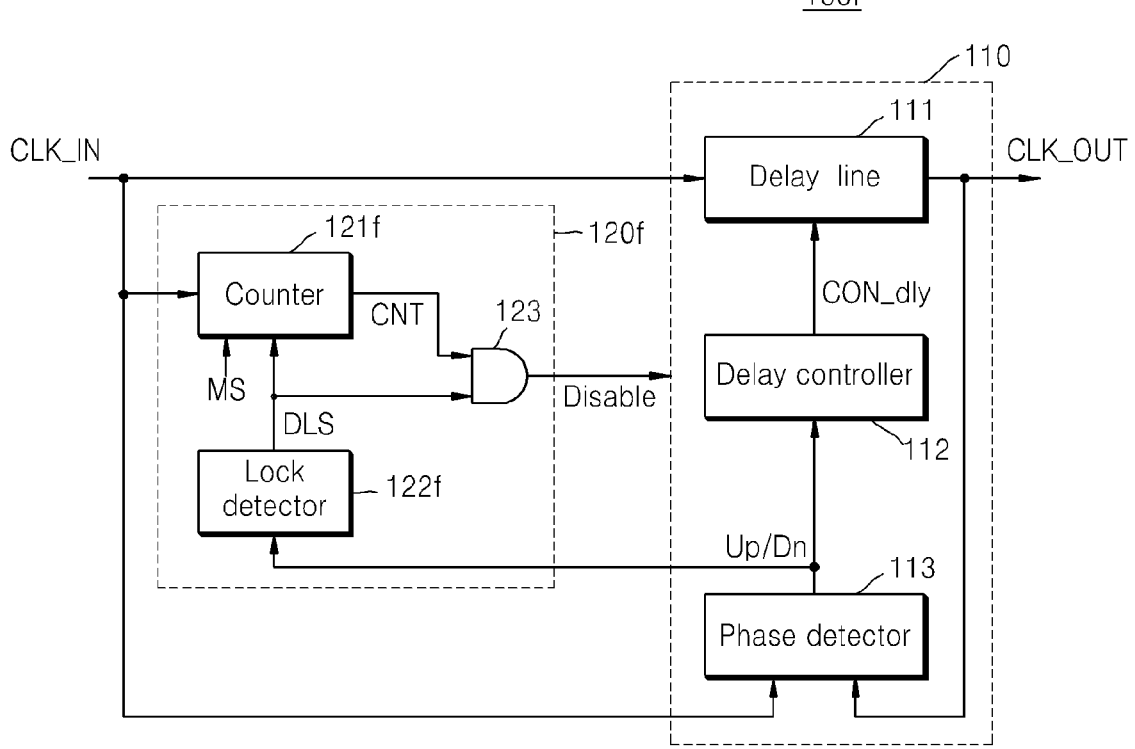
FIG. 11 is a block diagram illustrating another modification of the clock synchronization circuit of FIG. 1 according to an embodiment of the inventive concept.

FIG. 11 is a block diagram illustrating a clock synchronization circuit 100f that is another modification of the clock synchronization circuit 100 of FIG. 1 or the clock synchronization circuit 100e of FIG. 9.

Elements of the clock synchronization circuit 100f of FIG. 11 are similar to those of the clock synchronization circuit 100e of FIG. 9.

However, in FIG. 11, a mode setting signal MS may be applied to a counter 121f, and the counter 121f may operate in a first mode or a second mode. The delay-locked signal DLS may be applied to not only the logic gate 123 but also the counter 121f.

The clock synchronization circuit 100f may selectively operate like the clock synchronization circuit 100a of FIG. 2 or the clock synchronization circuit 100e of FIG. 9 according to the mode setting signal MS that is applied to the counter 121f.

The counter 121f may count the input clock signal CLK_IN to obtain a counting value, and when the counting value is equal to or greater than a predetermined value, the counter 121f may generate the counting signal CNT. In this case, in response to the mode setting signal MS, when the counter 121f operates in the first mode, the counter 121f may operate irrespective of the delay-locked signal DLS and when the counter 121f operates in the second mode, the counter 121f may be reset in response to the delay-locked signal DLS.

Accordingly, in the first mode, a delay-locked control unit 120f may determine whether the DLL 110 is locked when a predetermined period of time after the clock synchronization circuit 100f starts to operate, and may generate the delay-locked disable signal Disable. In the second mode, since the counter 121f may be reset in response to the delay-locked signal DLS even after the counter 121f starts to perform a counting operation, and thus the counter 121f may generate the counting signal CNT only when a locked state of the DLL 110 is maintained for a predetermined period of time, the delay-locked control unit 120f generates the delay-locked disable signal Disable after the locked state is maintained for the predetermined period of time.

The clock synchronization circuit 100f may operate under a variety of different environment conditions. For example, the clock synchronization circuit 100f may operate in an environment where a change in a voltage and a temperature is large, and may also operate in an environment where a change in a voltage and a temperature is small. In the environment where the change in the voltage and the temperature is small, the possibility that a phase of the output clock signal CLK_OUT is changed after the DLL 110 is locked is relatively low. Accordingly, the clock synchronization circuit 100f may be set to operate the counter 121f in the first mode, to determine whether the DLL 110 is locked when a predetermined period of time passes after the clock synchronization circuit 100f starts to operate, and to finish a delay-locking operation when the DLL 110 is locked. Alternatively, in the environment where the change in the voltage and the temperature is large, the clock synchronization circuit 100f may be set to operate the counter 121f in the second mode and to finish the delay-locking operation when a locked state of the DLL 110 is maintained for a predetermined period of time, thereby providing sufficient time to stabilize the output clock signal CLK_OUT.

Figure 12:
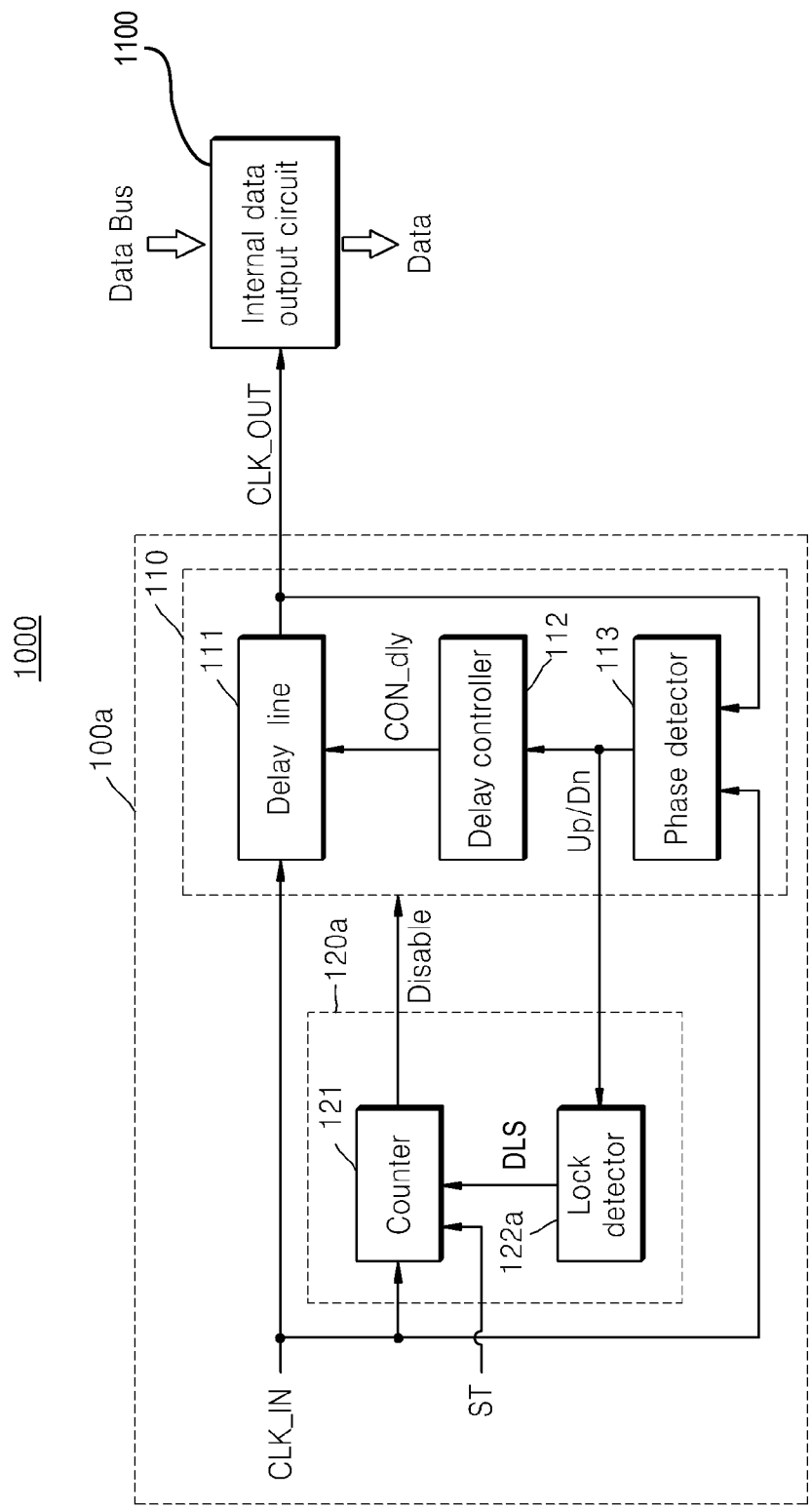
FIG. 12 is a block diagram illustrating a semiconductor device according to an embodiment of the inventive concept according to an embodiment of the inventive concept.

FIG. 12 is a block diagram illustrating a semiconductor device 1000 according to an embodiment of the inventive concept.

Referring to FIG. 12, the semiconductor device 1000 may include the clock synchronization circuit 100a and a data output circuit 1100. The semiconductor device 1000 that is a device for transmitting/receiving data in synchronization with an external memory device may be a memory device or a timing controller of a display driver. Although the clock synchronization circuit 100a of FIG. 2 is used in FIG. 12, the present embodiment is not limited thereto. A clock synchronization circuit included in the semiconductor device 1000 may be any one of the clock synchronization circuits 100, 100a, 100b, 110c, 100d, 100d', 100e, and 100f according to the embodiments of the inventive concept.

The clock synchronization circuit 100a outputs the output clock signal CLK_OUT by delaying the input clock signal CLK_IN, and locks the input clock signal CLK_IN and the output clock signal CLK_OUT by performing a delay-locking operation. The data output circuit 1100 may output data DATA in the semiconductor device 1000 to the outside in synchronization with the output clock signal CLK_OUT.

As described with reference to FIG. 2, the clock synchronization circuit 100a finishes the delay-locking operation when a locked state is maintained for a predetermined period of time. Accordingly, the phase detector 113 and the delay controller 112 of the DLL 110 may not operate, and an operation of the delay-locked control unit 120a may also be stopped.

The clock synchronization circuit 100a may receive the state change signal ST indicating a change in an operational state of the semiconductor device 1000, and may be reset in response to the state change signal ST. For example, the state change signal ST may be applied to the counter 121 and the counter 121 may be reset. When a predetermined condition is satisfied, for example, when a locked state of the DLL 110 is maintained for a predetermined period of time, the delay-locked disable signal Disable may be generated to finish the delay-locking operation, and when the counter 121 is reset in response to the state change signal ST, the delay-locking operation may be resumed.

Accordingly, when an operational state of the semiconductor device 1000 is changed even after the delay-locking operation is finished, the clock synchronization circuit 100 may resume the delay-locking operation, that is, a DLL updating operation.

Figure 13:
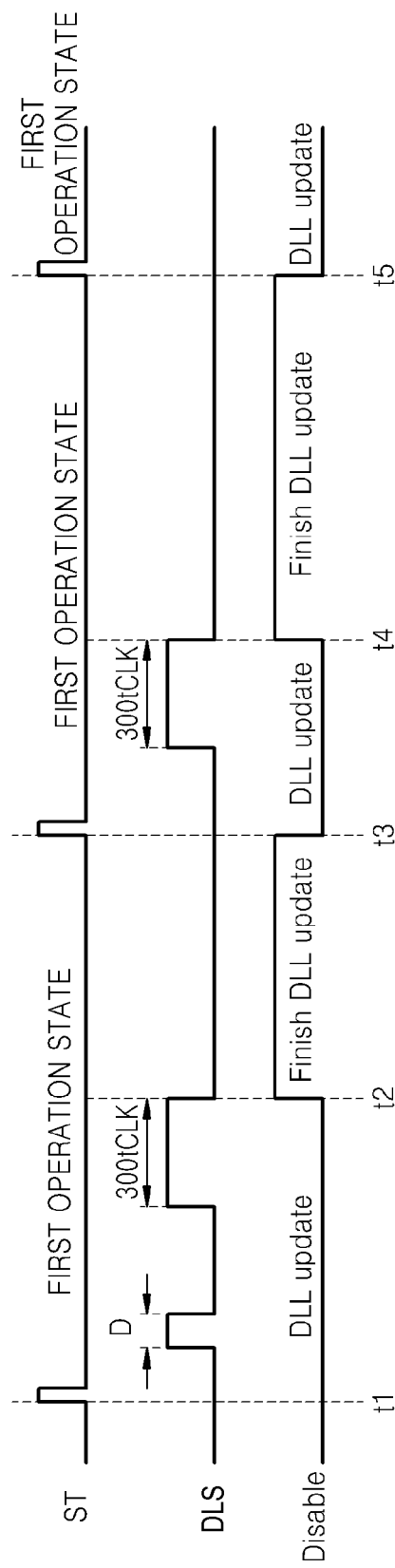
FIG. 13 is a timing diagram illustrating an operational example of a clock synchronization circuit of the semiconductor device of FIG. 12.

FIG. 13 is a timing diagram illustrating an operational example of the clock synchronization circuit 100a of the semiconductor device 1000 of FIG. 12.

Referring to FIG. 13, at a time t1, the state change signal ST may be applied, and a DLL updating operation of the clock synchronization circuit 100a may be performed. When the DLL 110 is locked, the delay-locked signal DLS having a first logic level is output from the locked detector 121a. When a locked state is maintained for a predetermined period of time, for example, for a time of 300 cycles 300 tCLK, the delay-locked disable signal Disable may be generated from the counter 121 at a time t2, to finish a delay-locking operation.

Next, when the state change signal ST is generated at a time t3, the DLL updating operation may be performed. As shown in FIG. 13, when an operational state of the semiconductor device 1000 is changed at times t3 and t5 even after the delay-locking operation of the clock synchronization circuit 100a is finished, the state change signal ST may be received and the delay-locking operation may be performed.

Since an operational state of the semiconductor device 1000 such as a memory device is repeatedly changed, the clock synchronization circuit 100a may have the same effect as that obtained by periodically performing a DLL updating operation.

Figure 14A:
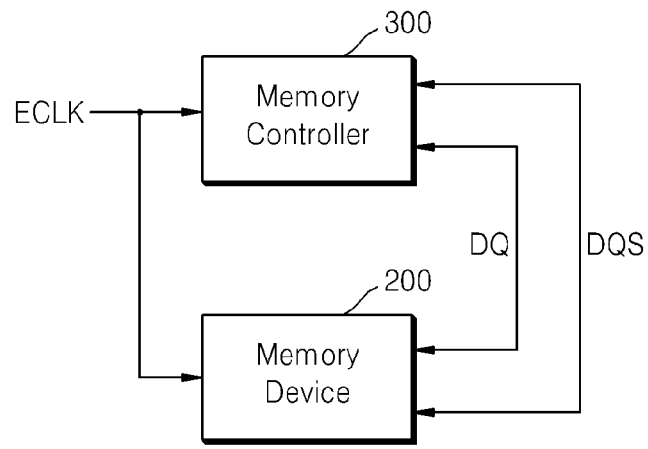
FIG. 14A is a block diagram illustrating a case where an output clock signal of a clock synchronization circuit is a data strobe signal of a semiconductor memory device, according to an embodiment of the inventive concept.
Figure 14B:
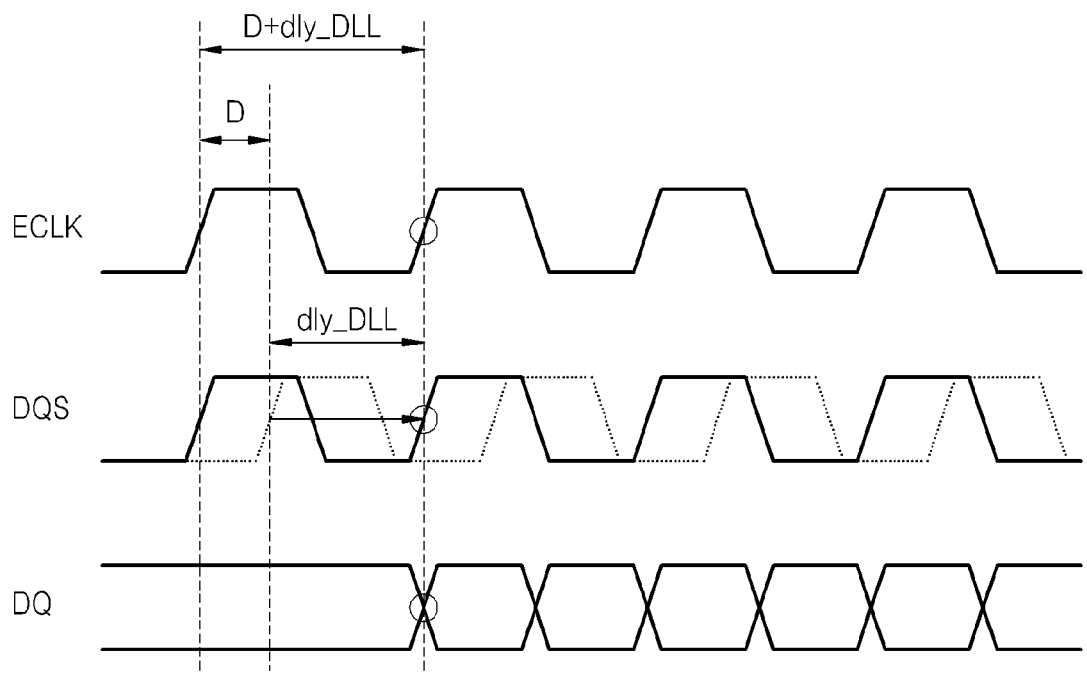
FIG. 14B is a timing diagram illustrating an operational example of the semiconductor memory device of FIG. 14A.

FIG. 14A is a block diagram illustrating a case where an output clock signal of a clock synchronization circuit is a data strobe signal, according to an embodiment of the inventive concept. FIG. 14B is a timing diagram of the semiconductor memory device of FIG. 14A.

Referring to FIG. 14A, a memory device 200 and a memory controller 300 may operate based on an external clock signal ECLK that is applied by an external device such as a central processing unit. When the memory device 200 receives data DQ from the memory controller 300 or transmits the data DQ to the memory controller 300, the memory device 200 and the memory controller 300 may operate in synchronization with a data strobe signal DQS that is a separate clock signal generated based on the external clock signal ECLK. The data strobe signal DQS that is an internal clock signal generated by the memory device 200 or the memory controller 300 based on the external clock signal ECLK may not be synchronized with the external clock signal ECLK due to a delay component D of an internal circuit as shown in FIG. 14B. Accordingly, the memory device 200 may include the clock synchronization circuit 100, and may synchronize the data strobe signal DQS with the external clock signal ECLK. The data strobe signal DQS may be further delayed by the delay time dly_DLL and may be synchronized with the external clock signal ECLK. In this case, the external clock signal ECLK may be the input clock signal CLK_IN of the clock synchronization circuit 100, and the data strobe signal DQS may be the output clock signal CLK_OUT. When the data strobe signal DQS is synchronized with the external clock signal ECLK by the clock synchronization circuit 100, the data DQ may be output or received at a rising edge or a falling edge of the data strobe signal DQS.

Figure 15A:
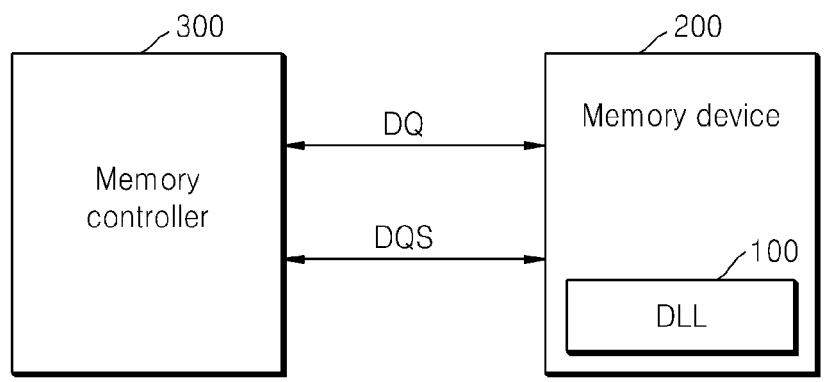
FIGS. 15A and 15B are block diagrams examples where the clock synchronization circuit is applied to a memory device.
Figure 15B:
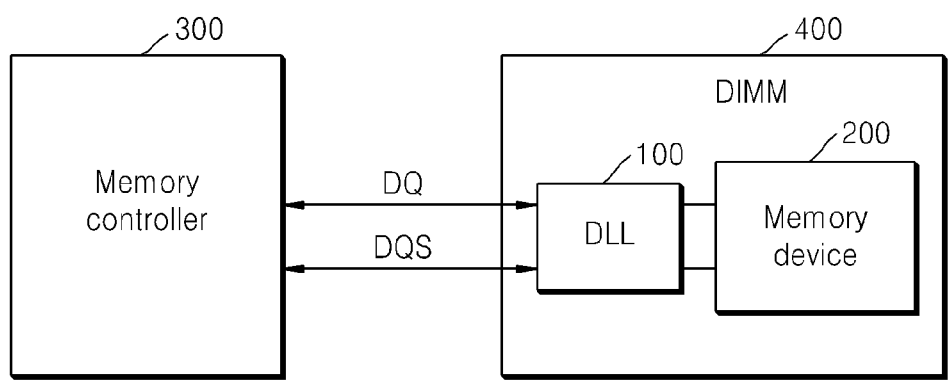

FIGS. 15A and 15B are block diagrams illustrating examples where the clock synchronization circuit 100 is applied to the memory device 200.

The clock synchronization circuit 100 may be provided in the memory device 200 as shown in FIG. 15A. The clock synchronization circuit 100 may generate the data strobe signal DQS, and the memory device 200 may transmit and receive the data DQ to and from the memory controller 300 based on the data strobe signal DQS.

The clock synchronization circuit 100 may be provided in a memory module 400 that includes the memory device 200 as shown in FIG. 15B. Although the memory module 400 includes only one memory device 200 in FIG. 15B, the present embodiment is not limited thereto. The memory module 400 may include a plurality of the memory devices 200. The clock synchronization circuit 100 may generate the data strobe signal DQS used by the memory device 200 that is included in the memory module 400.

Figure 16:
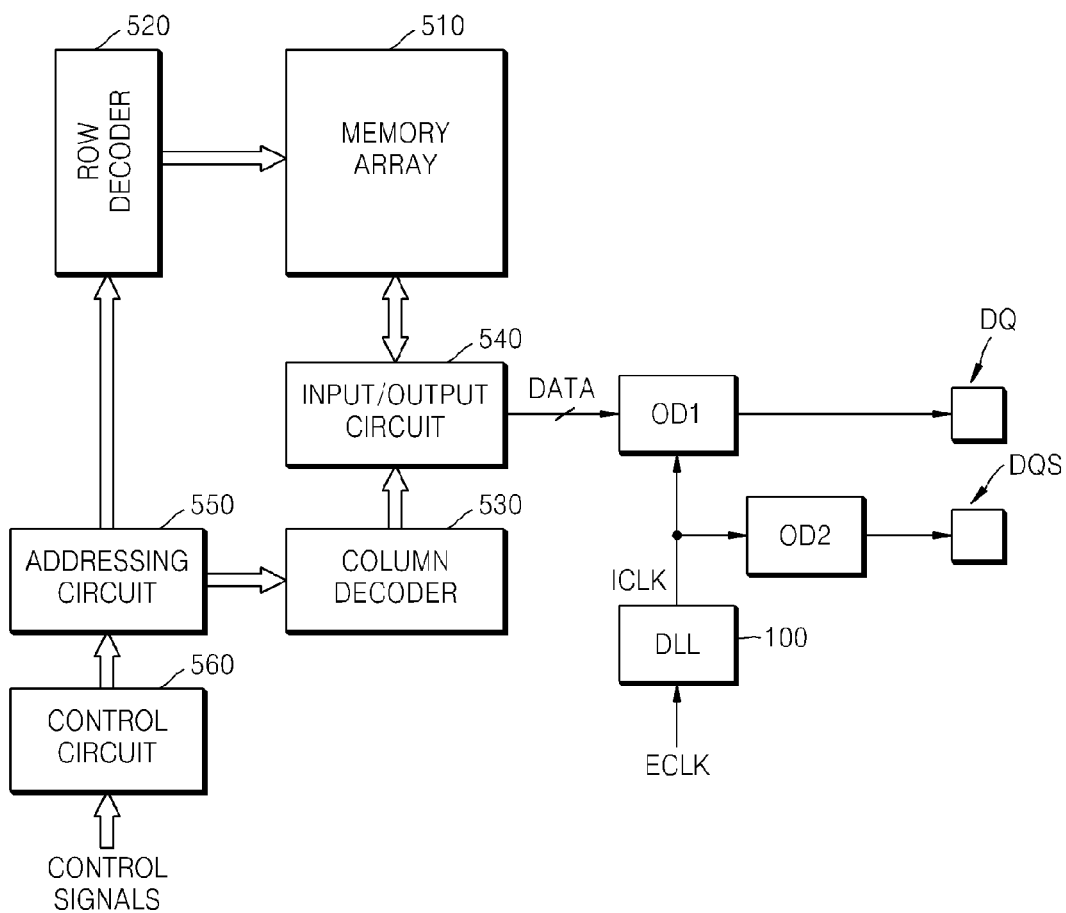
FIG. 16 is a block diagram illustrating a memory device according to an embodiment of the inventive concept.

FIG. 16 is a block diagram illustrating a semiconductor memory device according to an embodiment of the inventive concept.

Referring to FIG. 16, the semiconductor memory device may include the clock synchronization circuit 100, a memory array 510, a row decoder 520, a column decoder 530, an input/output circuit 540, an addressing circuit 550, and a control circuit 560.

The memory array 510 may include a plurality of word lines, a plurality of bit lines, and a plurality of memory cells that are connected between the plurality of word lines and the plurality of bit lines. Each of the plurality of memory cells may be a volatile memory cell such as a dynamic random-access memory (DRAM) or a synchronous dynamic random-access memory (SDRAM).

Alternatively, each of the plurality of memory cells may be a nonvolatile memory cell. Examples of nonvolatile memory include a phase change RAM (PRAM), a nano floating gate memory (NFGM), a magnetic RAM (MRAM), a ferroelectric RAM (FeRAM), a resistive RAM (RRAM), a nanotube RRAM, a holographic memory, a molecular electronics memory device, and an insulator resistance change memory. Each nonvolatile memory cell may store a single bit or a plurality of bits.

The row decoder 520 may select any one from among the plurality of word lines by receiving a row address output from the addressing circuit 550 and decoding the received row address. The column decoder 530 may select any one from among the plurality of bit lines by receiving a column address output from the addressing circuit 550 and decoding the received column address.

The input/output circuit 540 may write data to at least one memory cell selected by the row decoder 520 and the column decoder 530. Also, the input/output circuit 540 may read the data that is stored in the at least one memory cell selected by the row decoder 520 and the column decoder 530.

The addressing circuit 550 may generate a row address and a column address under the control of the control circuit 560. The control circuit 560 may generate a plurality of operation control signals for controlling an operation of the addressing circuit 550 in response to a plurality of control signals necessary to perform a write operation or a read operation.

The clock synchronization circuit 100 may transmit an internal clock signal ICLK that is synchronized with the external clock signal ECLK to output drivers OD1 and OD2. Accordingly, the first output driver OD1 may transmit a data signal DATA to a first pad DQ in response to the internal clock signal ICLK. Accordingly, a data write operation or a data read operation may be performed in synchronization with the internal clock signal ICLK. Also, the second output driver OD2 may transmit the internal clock signal ICLK to a second pad DQS. The first pad DQ and the second pad DQS that are pads of a semiconductor chip of the semiconductor memory device may be arranged on the semiconductor chip as center pads or edge pads.

Figure 17:
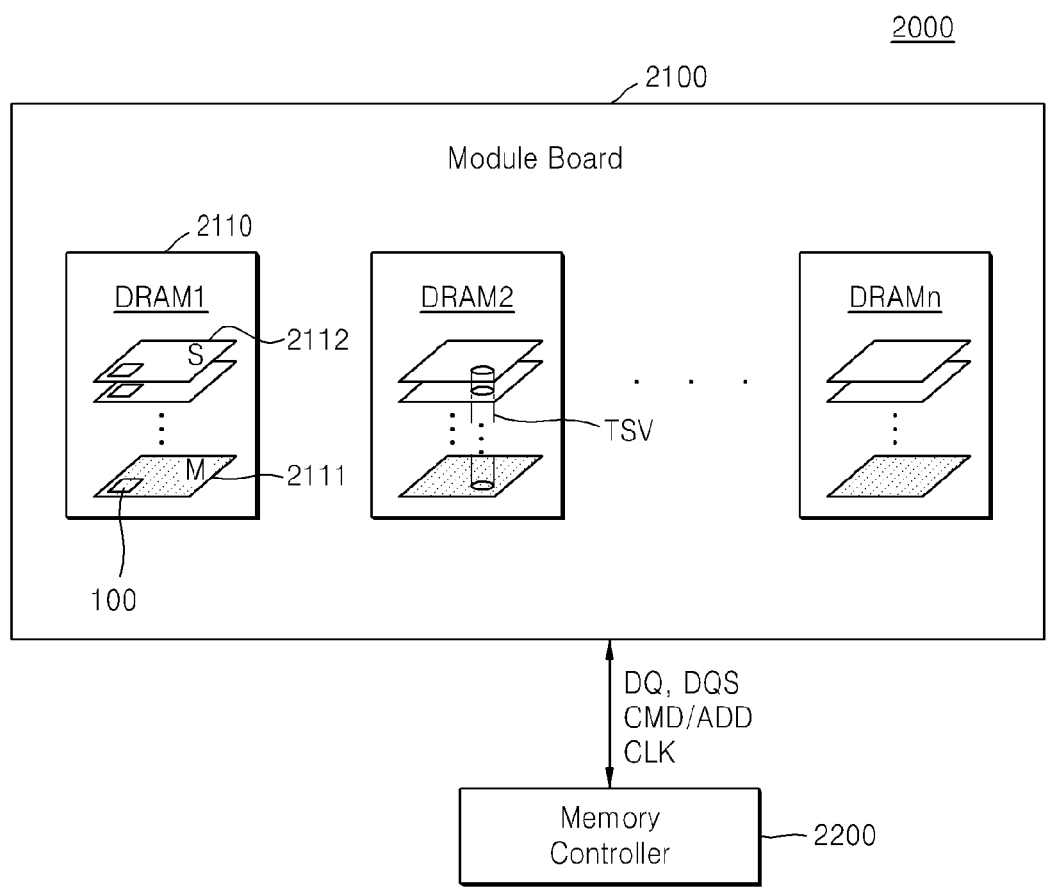
FIG. 17 is a diagram illustrating an example of a memory system to which the semiconductor memory device of FIG. 16 is applied.

FIG. 17 is a diagram illustrating an example of memory system 2000 to which the semiconductor memory device of FIG. 16 may be applied.

Referring to FIG. 17, the memory system 2000 may include a memory module 2100 and a memory controller 2200. The memory module 2100 may mount at least one semiconductor memory device 2110 on a module board. The semiconductor memory device 2110 may be a DRAM chip, and each semiconductor memory device 2110 may include a plurality of semiconductor layers. The semiconductor layers may include one or more master chips 2111 and one or more slave chips 2112. A signal may be transmitted between the semiconductor layers through a through silicon via (TSV). The master chips 2111 and the slave chips 2112 may include a memory array, a storage unit, and a refresh unit. Also, each of the master chips 2111 and the slave chips 2112 includes the clock synchronization circuit 100. The clock synchronization circuit 100 may be any one according to the embodiments of the inventive concept.

The memory module 2100 may communicate with the memory controller 2200 via a system bus. Data DQ, a data strobe signal DQS, a command/address CMD/ADD, and a clock signal CLK may be transmitted/received between the memory module 2100 and the memory controller 2200 via the system bus.

Figure 18:
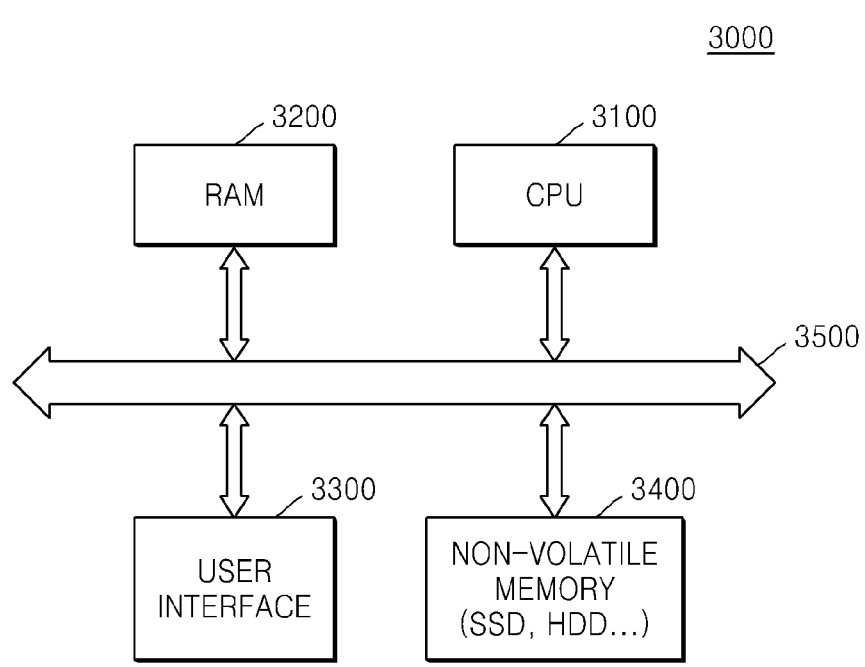
FIG. 18 is a block diagram illustrating a computing system on which a memory system is mounted, according to an embodiment of the inventive concept.

FIG. 18 is a block diagram illustrating an example computing system 3000 in which a semiconductor memory device is mounted, where the semiconductor memory device is configured according to one or more previously described embodiments of the inventive concepts.

The computing system 3000 of FIG. 18 includes a central processing unit (CPU) 3100, the RAM 3200, a user interface 3300, and a nonvolatile memory 3400, and the central processing unit (CPU) 3100, the RAM 3200, the user interface 3300, and the nonvolatile memory 3400 are electrically connected to a bus 3500. The nonvolatile memory 3400 may be a large storage device such as a solid state drive (SSD) or a hard disk drive (HDD). As examples, the computing system 3000 may be a mobile device or a desktop computer.

The semiconductor memory device configured according to one or more previously described embodiments of the inventive concepts may be mounted as the RAM 3200 and/or the non-volatile memory 3400 in the computing system 3000 of FIG. 18.

While the inventive concept has been particularly shown and described with reference to exemplary embodiments thereof by using specific terms, the embodiments and terms have merely been used to explain the inventive concept and should not be construed as limiting the scope of the inventive concept as defined by the claims. The exemplary embodiments should be considered in a descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A clock synchronization circuit comprising:
a delay-locked loop (DLL) configured to generate an output clock signal by delaying an input clock signal by a delay time, and to execute a delay-locking operation in which the delay time is adjusted to a locked state according to a comparison between the output clock signal and the input clock signal; and
a delay-locked control unit configured to detect the locked state of the DLL, and to generate a delay-locked disable signal when the locked state is detected as being maintained for a predetermined period of time, wherein the DLL is responsive to the delay-locked disable signal to terminate the delay-locking operation in which the delay time is adjusted,
wherein the delay-locked control unit is configured to generate the delay-locked disable signal responsive to an obtained court value of the input clock signal,
wherein the delay-locked control unit comprises:
a locked detector that determines whether the DLL is in the locked state, and outputs a delay-locked signal; and
a counter that counts a time in which the locked state is maintained based on the delay-locked signal to obtain the count value, and to output the delay-locked disable signal when the count value is equal to or greater than a predetermined value, and
wherein the counter counts the input clock signal when the delay-locked signal has first logic level, and the counter is rest when the delay-locked signal has a second logic level.

2. The clock synchronization circuit of claim 1, wherein when the delay-locking operation is terminated, the delay-locked control unit terminates the detected locked state of the DLL.

3. The clock synchronization circuit of claim 2, wherein the predetermined period of time is set according to an external setting signal.

4. The clock synchronization circuit of claim 2, wherein the predetermined period of time is set according to a phase difference between the input clock signal and the output clock signal in the locked state.

5. The clock synchronization circuit of claim 1, wherein the DLL comprises:
a phase detector configured to generate an up-down signal based on a phase difference between the input clock signal and the output clock signal;
a delay controller configured to output a delay control signal for adjusting the delay time in response to the up-down signal; and
a delay line configured to delay the input clock signal according to the delay control signal.

6. The clock synchronization circuit of claim 5, wherein the locked detector is configured to receive the up-down signal, and determine whether the DLL is in the locked state based on a number of repetitions of an up state or a down state of the up-down signal.

7. The clock synchronization circuit of claim 5, wherein the locked detector is configured to determine whether the DLL is locked based on the phase difference between the input clock signal and the output clock signal.

8. The clock synchronization circuit of claim 5, wherein the locked detector is configured to determine whether the DLL is locked based on a change in value of the delay control signal.

9. The clock synchronization circuit of claim 1, wherein the clock synchronization circuit is applied to a semiconductor device that inputs or outputs data in synchronization with an external device,
wherein when an operational state of the semiconductor device is changed, the delay-locking operation of the DLL is performed.

10. A clock synchronization circuit comprising:
a delay-locked loop (DLL) configured to generate an output clock signal by delaying an input clock signal by a delay time, and to execute a delay-locking operation in which the delay time is adjusted to a locked state according to a comparison between the output clock signal and the input clock signal; and
a delay-locked control unit configured to detect the locked state of the DLL, and to generate a delay-locked disable signal when the locked state is detected as being maintained for a predetermined period of time, wherein the DLL is responsive to the delay-locked disable signal to terminate the delay-locking operation in which the delay time is adjusted, wherein the delay-locked control unit is configured to generate the delay-locked disable signal responsive to an obtained count value of the input clock signal, wherein the delay-locked control unit comprises:
- a locked detector that determines whether the DLL is in the locked state, and outputs a delay-locked signal; and
- a counter that counts a time in which the locked state is maintained based on the delay-locked signal to obtain the count value, and to output the delay-locked disable signal when the count value is equal to or greater than a predetermined value, wherein the DLL comprises:
- a phase detector configured to generate an up-down signal based on a phase difference between the input clock signal and the output clock signal;
- a delay controller configured to output a delay control signal for adjusting the delay time in response to the up-down signal;
- a delay line configured to delay the input clock signal according to the delay control signal;
- a first clock buffer that buffers a received clock signal, and generates a first clock signal that is applied as a reference clock signal of the delay controller and as the input clock signal to the counter;
- a second clock buffer that buffers the received clock signal, and generates the input clock signal that is applied to the delay line;
- a third clock buffer that buffers an output of the delay line, and generates the output clock signal that is applied to the phase detector; and
- a fourth clock buffer that buffers the output of the delay line, and generates another output clock signal that has a same phase as the output clock signal that is applied to the phase detector, and wherein operations of the first clock buffer and the third clock buffer are stopped in response to the delay-locked disable signal.

11. A clock synchronization circuit comprising:
a delay-locked loop (DLL) configured to generate an output clock signal by delaying an input clock signal by a delay time, and to execute a delay-locking operation in which the delay time is adjusted to a locked state according to a comparison between the output clock signal and the input clock signal; and a delay-locked control unit configured to detect the locked state of the DLL, and to generate a delay-locked disable signal when the locked state is detected as being maintained for a predetermined period of time, wherein the DLL is responsive to the delay-locked disable signal to terminate the delay-locking operation in which the delay time is adjusted, wherein the delay-locked control unit is configured to generate the delay-locked disable signal responsive to an obtained count value of the input clock signal, wherein the delay-locked control unit comprises:
- a locked detector that determines whether the DLL is in the locked state, and outputs a delay-locked signal; and
- a counter that counts a time in which the locked state is maintained based on the delay-locked signal to obtain the count value, and to output the delay-locked disable signal when the count value is equal to or greater than a predetermined value, wherein the DLL comprises:
- a phase detector configured to generate an up-down signal based on a phase difference between the input clock signal and the output clock signal;
- a delay controller configured to output a delay control signal for adjusting the delay time in response to the up-down signal;
- a delay line configured to delay the input clock signal according to the delay control signal;
- a first clock buffer that buffers an output of the delay line, and generates a first clock signal that is applied as a reference clock signal of the delay controller and as the input clock signal to the counter, and is applied to the phase detector as the output clock signal; and
- a second clock buffer that buffers the output of the delay line, and generates a second clock signal that has a same phase as the output clock signal that is applied to the phase detector, and wherein an operation of the first clock buffer is stopped in response to the delay-locked disable signal.

* * * * *